United States Patent
Takahashi

(10) Patent No.: US 9,728,992 B2
(45) Date of Patent: Aug. 8, 2017

(54) CONTROL APPARATUS AND CONTROL METHOD FOR SECONDARY BATTERY

(75) Inventor: Kenji Takahashi, Toyota (JP)

(73) Assignee: TOYOTA JIDOSHA KABUSHIKI KAISHA, Toyota-shi, Aichi (JP)

( * ) Notice: Subject to any disclaimer, the term of this patent is extended or adjusted under 35 U.S.C. 154(b) by 308 days.

(21) Appl. No.: 14/371,354

(22) PCT Filed: Jan. 13, 2012

(86) PCT No.: PCT/JP2012/000190
§ 371 (c)(1),
(2), (4) Date: Jul. 9, 2014

(87) PCT Pub. No.: WO2013/105140
PCT Pub. Date: Jul. 18, 2013

(65) Prior Publication Data
US 2015/0022157 A1 Jan. 22, 2015

(51) Int. Cl.
*H02J 7/00* (2006.01)
*G01R 31/36* (2006.01)
*H01M 10/48* (2006.01)
*H01M 10/052* (2010.01)
*H01M 10/44* (2006.01)

(52) U.S. Cl.
CPC .......... *H02J 7/007* (2013.01); *G01R 31/3606* (2013.01); *H01M 10/482* (2013.01); *H01M 10/052* (2013.01); *H01M 10/441* (2013.01); *H01M 2220/20* (2013.01); *H02J 7/0057* (2013.01); *H02J 7/0077* (2013.01); *H02J 2007/0067* (2013.01); *Y02E 60/122* (2013.01)

(58) Field of Classification Search
CPC ........................................................ H02J 7/007
USPC ............................................................ 320/134
See application file for complete search history.

(56) References Cited

U.S. PATENT DOCUMENTS

| | | | |
|---|---|---|---|
| 5,808,428 A | 9/1998 | Ito et al. | |
| 8,093,902 B2* | 1/2012 | Nishi | G01R 31/3624 320/132 |
| 8,336,651 B2* | 12/2012 | Nishi | B60K 6/445 180/65.29 |
| 8,373,419 B2* | 2/2013 | Ugaji | G01R 31/3679 320/107 |
| 8,615,372 B2* | 12/2013 | Tomura | G01R 31/3651 702/63 |
| 2010/0085057 A1 | 4/2010 | Nishi et al. | |

(Continued)

FOREIGN PATENT DOCUMENTS

EP 2325664 A1 5/2011
JP 06-290817 A 10/1994
(Continued)

*Primary Examiner* — Samuel Berhanu
*Assistant Examiner* — Tessema Kebede
(74) *Attorney, Agent, or Firm* — Sughrue Mion, PLLC

(57) ABSTRACT

A control apparatus has a controller configured to control charge and discharge of a secondary battery. The controller acquires a positive electrode potential and a negative electrode potential of the secondary battery. The controller controls the charge and discharge of the secondary battery such that each of the positive electrode potential and the negative electrode potential changes within a range between an upper limit value and a lower limit value set for each of the positive electrode potential and the negative electrode potential.

2 Claims, 13 Drawing Sheets

(56) References Cited

U.S. PATENT DOCUMENTS

2011/0161025 A1    6/2011  Tomura et al.
2012/0091930 A1*   4/2012  Takahashi ........... B60L 11/1861
                                                       318/139

FOREIGN PATENT DOCUMENTS

| JP | 09-023512 A    | 1/1997  |
| JP | 2001-015177 A  | 1/2001  |
| JP | 2006-345634 A  | 12/2006 |
| JP | 2008-198434 A  | 8/2008  |
| JP | 2008-241246 A  | 10/2008 |
| JP | 2008-243373 A  | 10/2008 |
| JP | 2009-199934 A  | 9/2009  |
| JP | 2009-199936 A  | 9/2009  |
| JP | 2010-060384 A  | 3/2010  |
| JP | 2011-220917 A  | 11/2011 |
| WO | 2008/117732 A1 | 10/2008 |
| WO | 2011/128756 A1 | 10/2011 |

* cited by examiner

FIG. 8

| Symbol | Description |
|---|---|
| $C_{ej}$ | ION CONCENTRATION IN ELECTROLYTIC SOLUTION |
| $C_{sj}$ | ION CONCENTRATION IN ACTIVE MATERIAL |
| $C_{sj,max}$ | MAXIMUM ION CONCENTRATION |
| $C_{sej}$ | ION CONCENTRATION AT ACTIVE MATERIAL INTERFACE |
| $\phi_{ej}$ | POTENTIAL OF ELECTROLYTIC SOLUTION |
| $\phi_{sj}$ | POTENTIAL OF ACTIVE MATERIAL |
| $T$ | ABSOLUTE TEMPERATURE |
| $j_j$ | ION PRODUCTION AMOUNT IN UNIT VOLUME AND UNIT TIME (REACTION CURRENT DENSITY) $$I = \int j_j^{Li} dv$$ |
| $\alpha_{sj}$ | TRANSFER COEFFICIENT IN ELECTRODE REACTION $J_j$ (OXIDATION REACTION) |
| $\alpha_{cj}$ | TRANSFER COEFFICIENT IN ELECTRODE REACTION $J_j$ (REDUCTION REACTION) $\alpha sj + \alpha cj = 1$ |
| $F$ | FARADAY'S CONSTANT |
| $i_{0j}$ | EXCHANGE CURRENT DENSITY |
| $\eta_j$ | OVERVOLTAGE IN ELECTRODE REACTION $J_j$ |
| $U_j$ | OPEN CIRCUIT VOLTAGE (OCV) |
| $\theta_j$ | LOCAL SOC AT ACTIVE MATERIAL INTERFACE $$\theta_j = \frac{C_{sej}}{C_{sj\,max}}$$ |
| $R_f$ | FILM RESISTANCE OF ELECTRODE SURFACE |
| $t_+^0$ | TRANSFERENCE NUMBER OF ION |
| $D_{sj}$ | DIFFUSION COEFFICIENT OF ACTIVE MATERIAL |
| $D_{ej}^{eff}$ | EFFECTIVE DIFFUSION COEFFICIENT OF ELECTROLYTIC SOLUTION |
| $a_{sj}$ | SURFACE AREA OF ACTIVE MATERIAL PER UNIT VOLUME OF ELECTRODE |
| $r_{sj}$ | RADIUS OF ACTIVE MATERIAL |
| $\varepsilon_{sj}$ | VOLUME FRACTION (ACTIVE MATERIAL) $\varepsilon_s + \varepsilon_e + \varepsilon_p + \varepsilon_f = 1$ |
| $\varepsilon_{ej}$ | VOLUME FRACTION (ELECTROLYTIC SOLUTION) |
| $K_j^{eff}$ | EFFECTIVE ION CONDUCTIVITY OF ELECTROLYTIC SOLUTION |
| $K_{Dj}^{eff}$ | DIFFUSION CONDUCTIVITY OF ELECTROLYTIC SOLUTION |
| $\sigma_j^{eff}$ | EFFECTIVE CONDUCTIVITY OF ACTIVE MATERIAL |
| $I$ | CURRENT DENSITY (PER UNIT SURFACE AREA OF ELECTRODE PLATE) |
| $L_j$ | THICKNESS OF ELECTRODE |

CONTROL APPARATUS AND CONTROL METHOD FOR SECONDARY BATTERY

CROSS REFERENCE TO RELATED APPLICATIONS

This is a National Stage of International Application No. PCT/JP2012/000190 filed Jan. 13, 2012, the contents of which are incorporated herein by reference in its entirety.

TECHNICAL FIELD

The present invention relates to a control apparatus and a control method for controlling charge and discharge of a secondary battery.

BACKGROUND ART

During control of charge and discharge of a secondary battery, it is necessary to prevent overdischarge and overcharge of the secondary battery. Specifically, the charge of the secondary battery is controlled such that the voltage of the secondary battery does not exceed a predefined upper limit voltage. In addition, the discharge of the secondary battery is controlled such that the voltage of the secondary battery does not fall below a predefined lower limit voltage.

PRIOR ART DOCUMENTS

Patent Documents

[Patent Document 1] Japanese Patent Laid-Open No. 09-023512
[Patent Document 2] Japanese Patent Laid-Open No. 2006-345634
[Patent Document 3] Japanese Patent Laid-Open No. 2008-198434
[Patent Document 4] Japanese Patent Laid-Open No. 2009-199934
[Patent Document 5] Japanese Patent Laid-Open No. 2009-199936
[Patent Document 6] Japanese Patent Laid-Open No. 2008-243373
[Patent Document 7] Japanese Patent Laid-Open No. 2008-241246
[Patent Document 8] Japanese Patent Laid-Open No. 2010-060384
[Patent Document 9] Japanese Patent Laid-Open No. 2000-030754

DISCLOSURE OF THE INVENTION

Problems to be Solved by the Invention

A side reaction of the secondary battery occurs in association with a positive electrode potential and a negative electrode potential rather than the voltage of the secondary battery. The side reaction refers to a reaction associated with the charge/discharge state of the secondary battery. To suppress the side reaction of the secondary battery, it is preferable to monitor the positive electrode potential and the negative electrode potential of the secondary battery while current is passed through the battery rather than to monitor the voltage of the secondary battery.

Means for Solving the Problems

According to a first aspect, the present invention provides a control apparatus having a controller configured to control charge and discharge of a secondary battery. The controller acquires a potential of a positive electrode and a potential of a negative electrode of the secondary battery. The controller controls the charge and discharge of the secondary battery such that each of the positive electrode potential and the negative electrode potential changes within a range between an upper limit value and a lower limit value set for each of the positive electrode potential and the negative electrode potential. According to the first aspect of the present invention, the monitoring of the positive electrode potential and the negative electrode potential can suppress a side reaction occurring in association with the level of each of the positive electrode potential and the negative electrode potential.

A potential difference corresponding to a resistance provided by adding a reaction resistance component and a diffusion resistance component of the secondary battery can be used to correct an open circuit potential of each of the positive electrode and the negative electrode in the acquisition of the positive electrode potential and the negative electrode potential. Since the side reaction occurring in the secondary battery tends to depend on the reaction resistance component and the diffusion resistance component, only those resistance components can be considered to suppress the side reaction effectively.

In charging the secondary battery, the open circuit potential of the positive electrode can be increased and the open circuit potential of the negative electrode can be reduced by the potential difference corresponding to the resistance of the two components, respectively. In discharging the secondary battery, the open circuit potential of the positive electrode can be reduced and the open circuit potential of the negative electrode can be increased by the potential difference corresponding to the resistance of the two components, respectively.

A deterioration parameter can be used to correct a local charge rate of each of the positive electrode and the negative electrode, and an open circuit potential of each of the positive electrode and the negative electrode can be corrected on the basis of the corrected local charge rate and open circuit potential characteristic data in the acquisition of the positive electrode potential and the negative electrode potential. The deterioration parameter includes a single electrode capacity ratio in the positive electrode, a single electrode capacity ratio in the negative electrode, and a variation in battery capacity of the secondary battery due to a change in correspondence between an average charge rate within an active material of the positive electrode and an average charge rate within an active material of the negative electrode, the change being a change from an initial state. The open circuit potential characteristic data is data defining the relationship between the local charge rate at a surface of the active material of the positive electrode and the open circuit potential of the positive electrode and the relationship between the local charge rate at a surface of the active material of the negative electrode and the open circuit potential of the negative electrode.

The positive electrode potential and the negative electrode potential can be detected by using a reference electrode instead of the calculation described above. A voltage change amount resulting from a DC resistance component of the secondary battery can be subtracted from the positive electrode potential and the negative electrode potential acquired by using the reference electrode. Therefore the positive electrode potential and the negative electrode potential can be acquired. Since the side reaction occurring in the secondary battery tends to depend on the reaction resistance component and the diffusion resistance component, only those resistance components can be considered to suppress the side reaction effectively.

An upper limit value of electric power to which input to the secondary battery is allowed can be reduced when the positive electrode potential is higher than an upper limit value for the positive electrode potential or when the negative electrode potential is lower than a lower limit value for the negative electrode potential. This can suppress the occurrence of the side reaction found when the positive electrode potential is higher than the upper limit value or the occurrence of the side reaction found when the negative electrode potential is lower than the lower limit value.

An upper limit value of electric power to which output from the secondary battery is allowed can be reduced, when the positive electrode potential is lower than a lower limit value for the positive electrode potential or when the negative electrode potential is higher than an upper limit value for the negative electrode potential. This can suppress the occurrence of the side reaction found when the positive electrode potential is lower than the lower limit value or the occurrence of the side reaction found when the negative electrode potential is higher than the upper limit value.

According to a second aspect, the present invention provides a control method for controlling charge and discharge of a secondary battery, including acquiring a potential of a positive electrode and a potential of a negative electrode of the secondary battery, and controlling the charge and discharge of the secondary battery such that each of the positive electrode potential and the negative electrode potential changes within a range between an upper limit value and a lower limit value set for each of the positive electrode potential and the negative electrode potential. The second aspect of the present invention can achieve the same advantages as those in the first aspect.

BRIEF DESCRIPTION OF THE DRAWINGS

FIG. 8 A list of variables and the like used in a battery model expression

MODE FOR CARRYING OUT THE INVENTION

Preferred embodiments of the present invention will hereinafter be described.
Embodiment 1

Figure 1:
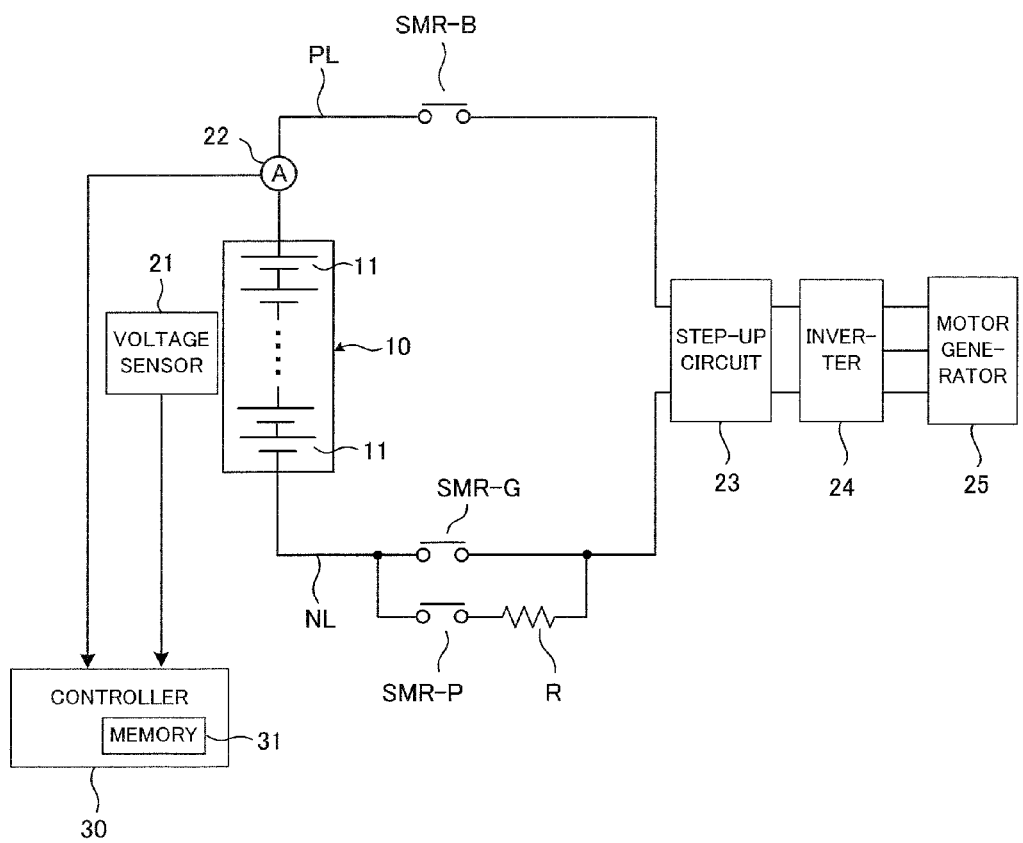
FIG. 1 A diagram showing the configuration of a battery system.

A battery system which is Embodiment 1 of the present invention is now described with reference to FIG. 1. FIG. 1 is a diagram showing the configuration of the battery system. The battery system of the present embodiment can be mounted on a vehicle.

Examples of the vehicle include a hybrid vehicle and an electric vehicle. The hybrid vehicle includes an engine or a fuel cell in addition to an assembled battery, later described, as the power source for running the vehicle. The electric vehicle includes only the assembled battery, later described, as the power source for running the vehicle.

An assembled battery 10 has a plurality of cells 11 connected in series. A secondary battery such as a nickel metal hydride battery or a lithium-ion battery can be used as the cell 11. The number of the cells 11 constituting the assembled battery 10 can be set as appropriate on the basis of the output or the like required of the assembled battery 10. Although all the cells 11 constituting the assembled battery 10 are connected in series in the present embodiment, the present invention is not limited thereto. The assembled battery 10 may include a plurality of cells 11 connected in parallel.

The cell 11 has a power-generating element capable of charge and discharge and a battery case housing the power-generating element. The power-generating element is formed of a positive electrode plate, a negative electrode plate, and a separator disposed between the positive electrode plate and the negative electrode plate, for example. The positive electrode plate has a collector plate and a positive electrode active material layer formed on a surface of the collector plate. The negative electrode plate has a collector plate and a negative electrode active material layer formed on a surface of the collector plate. The positive electrode active material layer includes a positive electrode active material, a conductive agent and the like. The negative electrode active material layer includes a negative electrode active material, a conductive agent and the like.

When the lithium-ion secondary battery is used as the cell 11, for example, the collector plate of the positive electrode plate can be made of aluminum and the collector plate of the negative electrode plate can be made of copper. $LiCo_{1/3}Ni_{1/3}Mn_{1/3}O_2$ can be used as the positive electrode active material and carbon can be used as the negative electrode active material, by way of example. The separator, the positive electrode active material layer, and the negative electrode active material layer are impregnated with an electrolytic solution. Instead of the electrolytic solution, a solid electrolyte layer may be placed between the positive electrode plate and the negative electrode plate.

A voltage sensor 21 detects the voltage of each of the cells 11 and outputs the detection result to a controller 30. Although the voltage of each cell 11 is detected by the voltage sensor 21 in the present embodiment, the present invention is not limited thereto. Specifically, the cells 11 constituting the assembled battery 10 may be divided into a plurality of battery blocks, and the voltage of each of the battery blocks may be detected. The plurality of battery blocks are connected in series, and each battery block includes a plurality of cells 11 connected in series. The number of the cells 11 constituting each battery block can be set as appropriate.

A current sensor 22 detects the value of current passing through the assembled battery 10 (cell 11) and outputs the detection result to the controller 30. The controller 30 contains a memory 31. The memory 31 stores programs for operating the controller 30 and specific information. The memory 31 may be provided outside the controller 30.

A system main relay SMR-B is provided on a positive electrode line PL for the assembled battery 10. The system main relay SMR-B is switched between ON and OFF in response to a control signal from the controller 30. A system main relay SMR-G is provided on a negative electrode line NL for the assembled battery 10. The system main relay SMR-G is switched between ON and OFF in response to a control signal from the controller 30.

The system main relay SMR-G is connected in parallel to a system main relay SMR-P and a current limiting resistor R. The system main relay SMR-P and the current limiting resistor R are connected in series. The system main relay SMR-P is switched between ON and OFF in response to a control signal from the controller 30. The current limiting resistor R is used to prevent an inrush current from passing in connecting the assembled battery 10 to a load (specifically, a step-up circuit 23, later described).

The controller 30 controls ON and OFF of the system main relays SMR-B, SMR-G, and SMR-P to connect the assembled battery 10 to the load or to break the connection between the assembled battery 10 and the load.

The step-up circuit 23 increases an output voltage from the assembled battery 10 and outputs the power at the increased voltage to an inverter 24. The step-up circuit 23 can also reduce an output voltage from the inverter 24 and outputs the power at the reduced voltage to the assembled battery 10. The step-up circuit 23 operates in response to a control signal from the controller 30. Although the step-up circuit 23 is used in the battery system of the present embodiment, the step-up circuit 23 may be omitted.

The inverter 24 converts the DC power output from the step-up circuit 23 into an AC power and outputs the AC power to a motor generator 25. The inverter 24 converts an AC power generated by the motor generator 25 into a DC power and outputs the DC power to the step-up circuit 23. A three-phase AC motor can be used as the motor generator 25, for example.

The motor generator 25 receives the AC power from the inverter 24 to generate a kinetic energy for running of the vehicle. In running the vehicle with the power from the assembled battery 10, the kinetic energy generated by the motor generator 25 is transferred to wheels.

For decelerating or stopping the vehicle, the motor generator 25 converts a kinetic energy generated in braking of the vehicle into an electric energy (AC power). The electric energy generated by the motor generator 25 is supplied to the assembled battery 10 through the inverter 24 and the step-up circuit 23. Thus, the assembled battery 10 can store the regenerative power.

Figure 2:
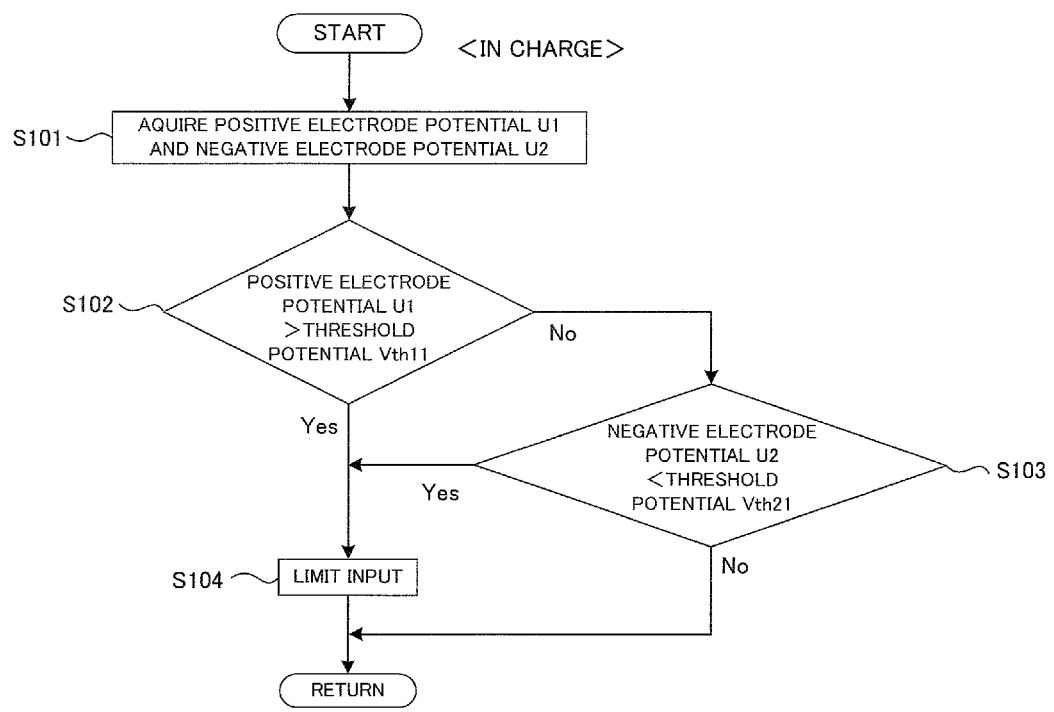
FIG. 2 A flow chart showing processing of controlling charge of a cell.

FIG. 2 is a flow chart showing processing of controlling charge of the cell 11. The processing shown in FIG. 2 is performed by the controller 30.

At step S101, the controller 30 acquires a positive electrode potential U1 and a negative electrode potential U2. The positive electrode potential U1 is an electric potential energy of the positive electrode active material relative to a reference potential, and the negative electrode potential U2 is an electric potential energy of the negative electrode active material relative to the reference potential. The positive electrode potential U1 and the negative electrode potential U2 can be detected by placing a reference electrode in the cell 11. The reference electrode is an electrode which provides a reference point for potential in measuring the positive electrode potential U1 and the negative electrode potential U2. A potential between the reference electrode and a positive electrode serves as the positive electrode potential U1, and a potential between the reference electrode and a negative electrode serves as the negative electrode potential U2. When the reference electrode is not used, the positive electrode potential U1 and the negative electrode potential U2 can be estimated as described later.

At step S102, the controller 30 determines whether or not the positive electrode potential U1 acquired at step S101 is higher than a threshold potential Vth11. The threshold potential Vth11 is a potential set on the basis of a side reaction which may occur in the cell 11.

Figure 3:
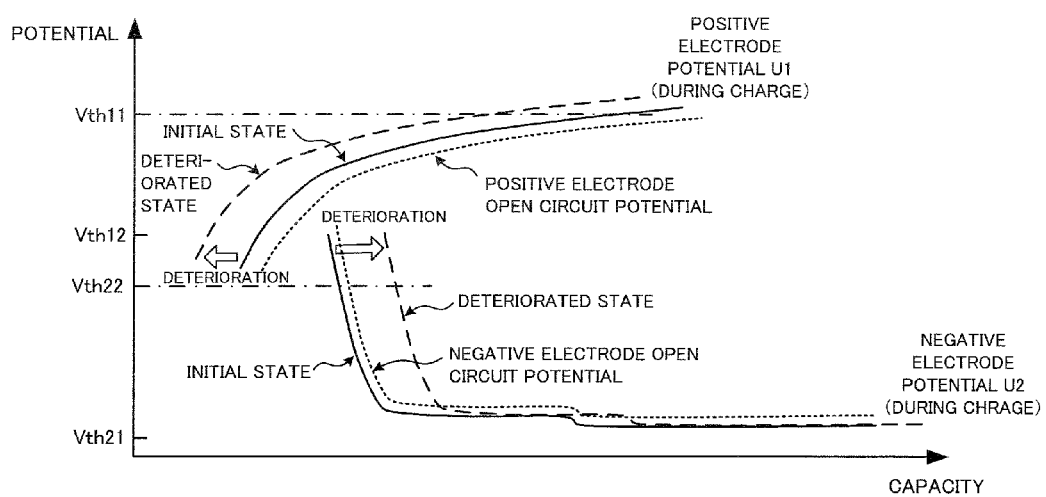
FIG. 3 A graph for explaining changes in positive electrode potential and negative electrode potential with deterioration of the cell.

As shown in FIG. 3, when the cell 11 is deteriorated, a composition correspondence between the positive electrode potential U1 and the negative electrode potential U2 is shifted. In FIG. 3, the vertical axis represents the potential and the horizontal axis represents the capacity of the cell 11.

Figure 5:
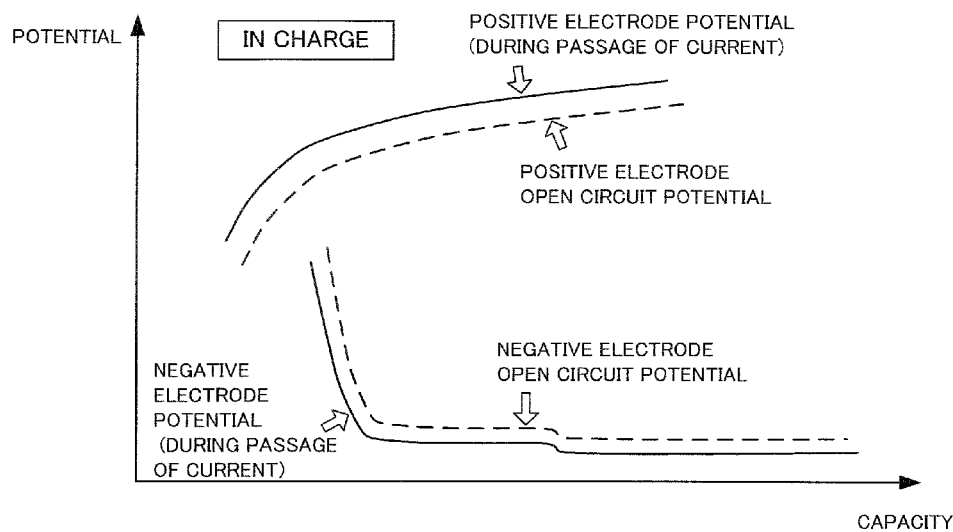
FIG. 5 A graph showing the relationship between a positive electrode open circuit potential and the positive electrode potential and the relationship between a negative electrode open circuit potential and the negative electrode potential in charge of the cell.
Figure 6:
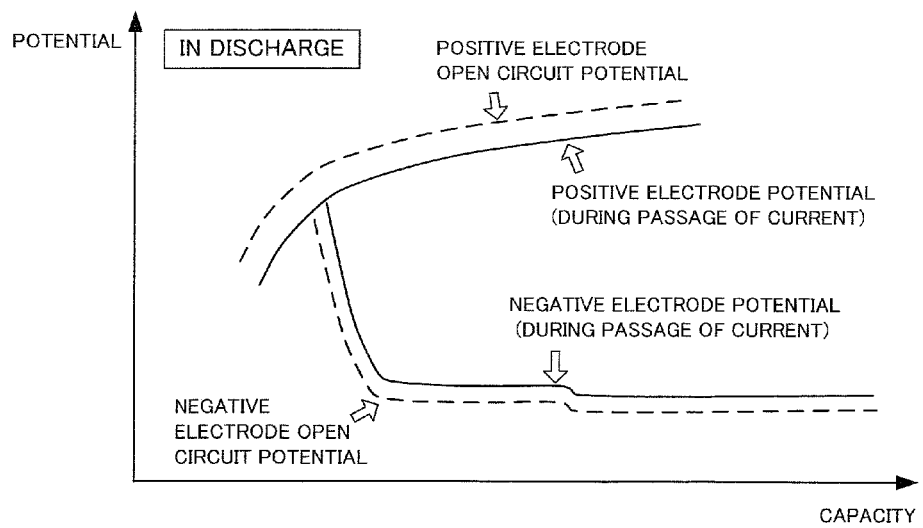
FIG. 6 A graph showing the relationship between the positive electrode open circuit potential and the positive electrode potential and the relationship between the negative electrode open circuit potential and the negative electrode potential in discharge of the cell.

In FIG. 3, the positive electrode potential U1 represents a positive electrode potential while current is passed through the cell 11 (during charge), and a positive electrode open circuit potential represents a positive electrode potential while no load is connected to the cell 11. As shown in FIG. 3 and FIG. 5, the positive electrode potential U1 during charge is higher than the positive electrode open circuit potential by the potential corresponding to the resistance component (internal resistance) of the cell 11. On the other hand, as shown in FIG. 6, the positive electrode potential U1 during discharge is lower than the positive electrode open circuit potential by the potential corresponding to the resistance component (internal resistance) of the cell 11.

In FIG. 3, the negative electrode potential U2 represents a negative electrode potential while current is passed through the cell 11 (during charge), and a negative electrode open circuit potential represents a negative electrode potential while no load is connected to the cell 11. As shown in FIG. 3 and FIG. 5, the negative electrode potential during charge is lower than the negative electrode open circuit potential by the potential corresponding to the resistance component (internal resistance) of the cell 11. On the other hand, as shown in FIG. 6, the negative electrode potential U2 during discharge is higher than the negative electrode open circuit potential by the potential corresponding to the resistance component (internal resistance) of the cell 11.

When the cell 11 is deteriorated, for example, the positive electrode potential U1 is shifted toward the left in FIG. 3 relative to the negative electrode potential U2, or the negative electrode potential U2 is shifted toward the right in FIG. 3 relative to the positive electrode potential U1. The shift amounts of the positive electrode potential U1 and the negative electrode potential U2 vary depending on the deterioration state of the cell 11. Specifically, the shift amounts of the positive electrode potential U1 and the negative electrode potential U2 are increased as the deterioration of the cell 11 proceeds. Although not shown in FIG. 3, the deterioration of the cell 11 reduces a positive electrode capacity and a negative electrode capacity. Specifically, a curve representing the relationship between the single electrode capacity (the positive electrode capacity or the negative electrode capacity) and the single electrode open circuit potential (the positive electrode open circuit potential or the negative electrode open circuit potential) is shortened due to the deterioration of the cell 11 as compared with a curve representing the initial state.

When the positive electrode potential U1 is higher than the threshold potential Vth11 in the charge of the cell 11, the side reaction may occur in the positive electrode. An example of the side reaction is decomposition of the electrolytic solution near the positive electrode. The threshold potential Vth11 can be previously determined by an experiment or the like, and the information about the threshold potential Vth11 can be stored in the memory 31.

When a plurality of side reactions occur in the positive electrode, the side reaction occurring first is specified, and the potential at which the specified side reaction occurs can be set as the threshold potential Vth11. The side reaction occurring first during the charge of the positive electrode is the side reaction which occurs at the lowest of the potentials among the side reactions. This setting of the threshold potential Vth11 can prevent any of the side reactions from occurring in the positive electrode.

When the positive electrode potential U1 is lower than the threshold potential Vth11 at step S102, the controller 30 proceeds to processing at step S103. When the positive electrode potential U1 is higher than the threshold potential Vth11, the controller 30 proceeds to processing at step S104.

At step S103, the controller 30 determines whether or not the negative electrode potential U2 acquired at step S101 is lower than a threshold potential Vth21. When the lithium-ion secondary battery is used as the cell 11, and the negative electrode potential U2 is lower than 0 V, a side reaction such as precipitation of lithium occurs. To prevent the side reaction (precipitation of lithium), the threshold potential Vth21 may be set at 0 V or a value higher than 0 V.

The threshold potential Vth21 can be previously determined by an experiment or the like in consideration of the side reaction occurring in the negative electrode. When a plurality of side reactions occur in the negative electrode, the side reaction occurring first is specified, and the potential at which the specified side reaction occurs can be set as the threshold potential Vth21. The side reaction occurring first during the charge of the negative electrode is the side reaction which occurs at the highest of the potentials among the side reactions. This setting can prevent any of the side reactions from occurring in the negative electrode. The information about the threshold potential Vth21 can be stored in the memory 31.

When the negative electrode potential U2 is higher than the threshold potential Vth21 at step S103, the controller 30 ends the processing shown in FIG. 2. When the negative electrode potential U2 is lower than the threshold potential Vth21, the controller 30 proceeds to the processing at step S104.

At step S104, the controller 30 limits the input to the cell 11 (charge). Specifically, the controller 30 reduces an upper limit electric power to which the input to the cell 11 is allowed. The charge of the cell 11 is controlled such that the input electric power to the cell 11 does not exceed the upper limit electric power. The reduced upper limit electric power restrains the charge of the cell 11. The reduction in the upper limit electric power includes setting the upper limit electric power at 0 kW. The setting of the upper limit electric power at 0 kW means that the cell 11 is not charged.

Figure 4:
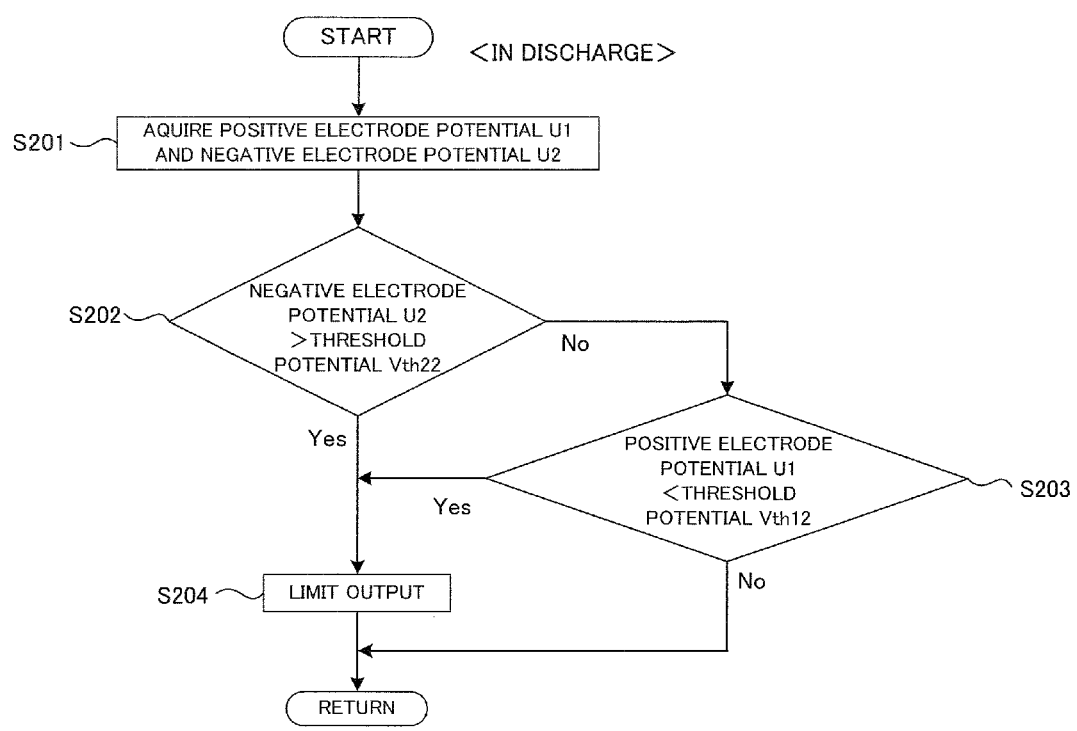
FIG. 4 A flow chart showing processing of controlling discharge of the cell.

FIG. 4 is a flowchart showing processing of controlling discharge of the cell 11. The processing shown in FIG. 4 is performed by the controller 30.

At step S201, the controller 30 acquires the positive electrode potential U1 and the negative electrode potential U2. The acquisition of the positive electrode potential U1 and the negative electrode potential U2 is performed similarly to that described at step S101 in FIG. 2.

At step S202, the controller 30 determines whether or not the negative electrode potential U2 acquired at step S201 is higher than a threshold potential Vth22. The threshold potential Vth22 is a potential set on the basis of the side reaction occurring in the cell 11.

When the negative electrode potential U2 is higher than the threshold potential Vth22 in the discharge of the cell 11, the side reaction may occur in the negative electrode. An example of the side reaction is dissolution of the material (for example, copper) forming the collector plate in the negative electrode. When the negative electrode potential U2 falls below the threshold potential Vth22 after the dissolution of the material forming the collector plate, the dissolved material may be precipitated again.

The threshold potential Vth22 can be previously determined by an experiment or the like in consideration of the side reaction. When a plurality of side reactions occur, the side reaction occurring first is specified, and the potential at which the specified side reaction occurs can be set as the threshold potential Vth22. The side reaction occurring first during the discharge of the negative electrode is the side reaction which occurs at the lowest of the potentials among the side reactions. This setting can prevent any of the side reactions from occurring in the negative electrode. The information about the threshold potential Vth22 can be stored in the memory 31.

When the negative electrode potential U2 is lower than the threshold potential Vth22 at step S202, the controller 30 proceeds to processing at step S203. When the negative electrode potential U2 is higher than the threshold potential Vth22, the controller 30 proceeds to processing at step S204.

At step S203, the controller 30 determines whether or not the positive electrode potential U1 acquired at step S201 is lower than a threshold potential Vth12. When the positive electrode potential U1 is extremely reduced, the side reaction may occur such as changes in structure and crystal structure of the positive electrode. The threshold potential Vth12 can be previously determined by an experiment or the like in consideration of the side reaction.

When a plurality of side reactions occur, the side reaction occurring first is specified, and the potential at which the specified side reaction occurs can be set as the threshold potential Vth12. The side reaction occurring first during the discharge of the positive electrode is the side reaction which occurs at the highest of the potentials among the side reactions. This setting can prevent any of the side reactions from occurring in the positive electrode. The information about the threshold potential Vth12 can be stored in the memory 31.

At step S203, when the positive electrode potential U1 is higher than the threshold potential Vth12, the controller 30 ends the processing shown in FIG. 4. When the positive electrode potential U1 is lower than the threshold potential Vth12, the controller 30 proceeds to the processing at step S204.

At step S204, the controller 30 limits the output from the cell 11 (discharge). Specifically, the controller 30 reduces an upper limit electric power to which the output from the cell 11 is allowed. The discharge of the cell 11 is controlled such that the output electric power from the cell 11 does not exceed the upper limit electric power. The reduced upper limit electric power restrains the discharge of the cell 11. The reduction in the upper limit electric power includes setting the upper limit electric power at 0 kW. The setting of the upper limit electric power at 0 kW means that the cell 11 is not discharged.

According to the present embodiment, the positive electrode potential and the negative electrode potential are monitored during the charge and discharge of the cell 11, so that the side reaction can be prevented from occurring in consideration of the each level of the positive electrode potential and the negative electrode potential.

Next, description is made of a method of estimating the positive electrode potential and the negative electrode potential. In the estimation of the positive electrode potential and the negative electrode potential, a battery model described below can be used.

Figure 7:
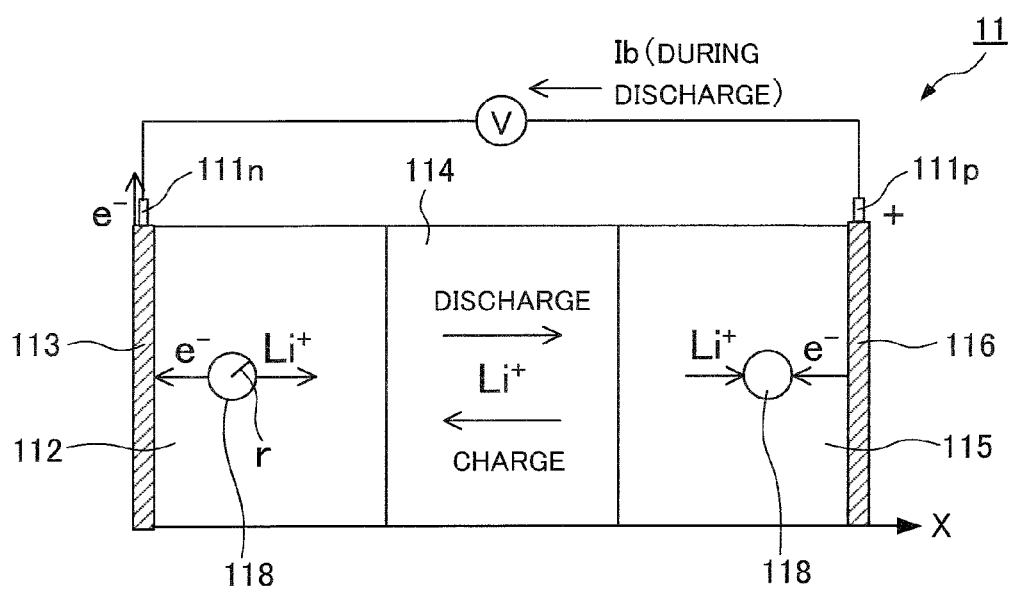
FIG. 7 A schematic diagram showing the configuration of the cell.

FIG. 7 is a schematic diagram showing the configuration of the cell 11. The cell 11 has a negative electrode (also referred to as an electrode) 112, a separator 114, and a positive electrode (also referred to as an electrode) 115. The separator 114 is placed between the negative electrode 112 and the positive electrode 115 and contains the electrolytic solution. A coordinate axis x shown in FIG. 7 is used to indicate a position in a thickness direction of the electrode.

Each of the negative electrode 112 and the positive electrode 115 is formed of a collection of active material spheres 118. During the discharge of the cell 11, a chemical reaction involving release of ions and electrons occurs at an interface of the active material 118 of the negative electrode 112. At an interface of the active material 118 of the positive electrode 115, a chemical reaction involving absorption of ions and electrons occurs.

The negative electrode 112 has a collector plate 113 which is electrically connected to a negative electrode terminal 111n of the cell 11. The positive electrode 115 has a collector plate 116 which is electrically connected to a positive electrode terminal 111p of the cell 11. The transfer of ions between the negative electrode 112 and the positive electrode 115 achieves the charge and discharge of the cell 11 to produce a discharge current Ib (>0) or a charge current Ib (<0).

A basic battery model expression used in the present embodiment is represented by basic equations including the following expressions (1) to (11). FIG. 8 shows a list of variables and constants used in the battery model expression.

In the variables and the constants in the model expression described below, a subscript e represents a value in the electrolytic solution and a subscript s represents a value in the active material. A subscript j provides a distinction between the positive electrode and the negative electrode, in which j equal to one represents a value for the positive electrode and j equal to two represents a value for the negative electrode. When the variables and the constants for the positive electrode and the negative electrode are collectively represented, the subscript j is omitted. The indications of (t) representing a function of time, (T) representing the dependence on battery temperature, and (θ) representing the dependence on local SOCθ may be omitted in the specification. A symbol # added to the variables and the constants represents an average value.

$$\frac{j_j(x, \theta_j, t)}{a_{sj}} = \quad (1)$$

$$i_{0j}(x, \theta_j, T, t) \cdot \left[ \exp\left(\frac{\alpha_{aj} F}{RT} \cdot \eta_j(x, \theta_j, t)\right) - \exp\left(-\frac{\alpha_{cj} F}{RT} \cdot \eta_j(x, \theta_j, t)\right) \right]$$

$$\eta_j(x, \theta, t) = \phi_{sj}(x, t) - \phi_{ej}(x, t) - U_j(x, \theta_j, t) \quad (2)$$

Expressions (1) and (2) represent an electrochemical reaction at the electrode (active material) and are called the Butler-Volmer equation.

An expression (3) holds as an expression relating to the conservation law of ion concentration in the electrolytic solution. A diffusion equation in an expression (4) and a boundary condition expression in expressions (5) and (6) are used as expressions relating to the conservation law of ion concentration in the active material. The expression (5) represents a boundary condition at the center of the active material, and the expression (6) represents a boundary condition at an interface between the active material and the electrolytic solution (hereinafter also referred to simply as an interface).

A local SOCθ$_j$ representing a local ion concentration distribution at the active material interface is defined by an expression (7). In the expression (7), $c_{sej}$ represents an ion concentration at the interfaces of the active materials of the positive electrode and the negative electrode as shown in the expression (8), and $c_{sj,max}$ represents a maximum ion concentration in the active material.

$$\frac{\delta[\varepsilon_{ej} \cdot c_{ej}(x, t)]}{\delta t} = \nabla \cdot \left[ D_{ej}^{eff} \nabla c_{ej}(x, t) \right] + \frac{1 - t_+^0}{F} \cdot j_j(x, \theta_j, t) - \frac{i_{ej} \cdot \nabla t_+^0}{F} \quad (3)$$

$$\frac{\partial c_{sj}(x, r_j, t)}{\partial t} = D_{sj} \left[ \frac{\partial^2 c_{sj}}{\partial r_j^2} + \frac{2}{r_j} \frac{\partial c_{sj}}{\partial r_j} \right] \quad (4)$$

$$\left. \frac{\partial c_{sj}(x, r_j, t)}{\partial r} \right|_{r_j=0} = 0 \quad (5)$$

$$\left. \frac{\delta[\varepsilon_{sj} \cdot c_{sj}(x, r_j, t)]}{\delta t} \right|_{r_j=r_{sj}} = -\frac{j_j(x, \theta_j, t)}{\alpha_{sj} F} \quad (6)$$

$$\theta_j = \frac{c_{sej}}{c_{sj,max}} \quad (7)$$

$$c_{sej} = c_{sj}(x, r_{sj}, t) \quad (8)$$

An expression (9) holds as an expression relating to the conservation law of charge in the electrolytic solution, and an expression (10) holds as an expression relating to the conservation law of charge in the active material. An expression (11) representing the relationship between a current density I(t) and a reaction current density $j_j$ holds as an electrochemical reaction expression at the active material interface.

$$\nabla \cdot [\kappa_j^{eff}(x,t) \nabla \phi_{ej}(x,t)] + \nabla \cdot [\kappa_{Dj}^{eff}(x,t) \nabla \ln c_{ej}(x,t)] + j_j(x, \theta_j, t) = 0 \quad (9)$$

$$\nabla \cdot [\sigma_j^{eff}(x,t) \nabla \phi_{sj}(x,t)] - j_j(x, \theta_j, t) = 0 \quad (10)$$

$$I(t) = \int_0^L j_2(x, \theta_2, t) = -\int_0^L j_1(x, \theta_1, t) \quad (11)$$

The battery model expression represented by the basic equations from the expressions (1) to (11) can be simplified as described below. The simplification of the battery model expression can reduce the computation load or shorten the computation time.

It is assumed that the electrochemical reactions uniformly occur in the negative electrode 112 and the positive electrode 115. In other words, it is assumed that the reactions in the x direction uniformly occur in the electrodes 112 and 115. Since it is assumed that the reactions occurring in the plurality of active materials included in each of the electrodes 112 and 115 uniformly occur, the active materials in each of the electrodes 112 and 115 are treated as a single active material model. This allows the structure of the secondary battery shown in FIG. 7 to be modeled as a structure shown in FIG. 9.

Figure 9:
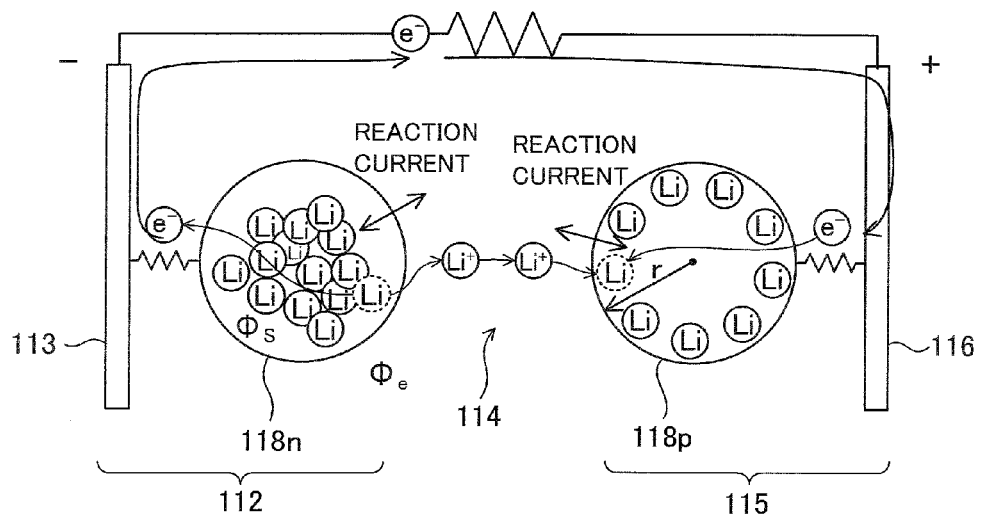
FIG. 9 A conceptual illustration for explaining a battery model.

A battery model shown in FIG. 9 allows modeling of electrode reactions at surfaces of an active material model 118p (j=1) and an active material model 118n (j=2) during charge and discharge. The battery model shown in FIG. 9 also allows modeling of diffusion of ions within the active material models 118p and 118n (in a diameter direction) and diffusion of ions in the electrolytic solution (concentration distribution). In addition, a potential distribution and a temperature distribution can be modeled in each portion of the battery model shown in FIG. 9.

Figure 10:
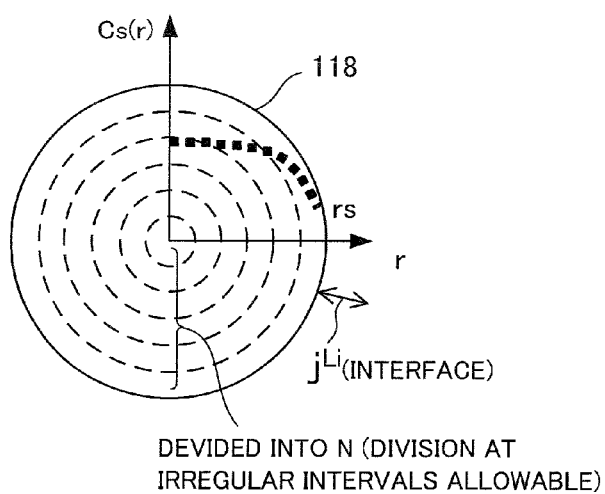
FIG. 10 A conceptual illustration showing an active material model represented with polar coordinates.

As shown in FIG. 10, a lithium concentration $c_s$ within each of the active material models 118p and 118n can be represented as a function on a coordinate r in the radial direction of the active material models 118n and 118p (where r represents a distance from the center to each point and $r_s$ represents the radius of the active material). It is assumed that no position dependence is present in a circumferential direction of the active material models 118p and 118n. An active material model shown in FIG. 10 is used for estimating an ion diffusion phenomenon within the active material associated with the electrochemical reaction at the interface. For each of regions (k=1 to N) provided by dividing each of the active material models 118p and 118n into N in a diameter direction (where N represents a natural number equal to or larger than two), an ion concentration $c_{s,k}(t)$ is estimated according to a diffusion equation, later described.

According to the battery model shown in FIG. 9, the basic equations (1) to (6) and (8) can be represented by the following expressions (1') to (6') and (8').

$$\frac{j_j\#(\theta_j, t)}{a_{sj}} = \tag{1'}$$
$$i_{0j}\#(\theta_j, T, t) \cdot \left[\exp\left(\frac{\alpha_{aj}F}{RT} \cdot \eta_j\#(\theta_j, t)\right) - \exp\left(-\frac{\alpha_{cj}F}{RT} \cdot \eta_j\#(\theta_j, t)\right)\right]$$

$$\eta_j\#(\theta_j, t) = \phi_{sj}\#(t) - \phi_{ej}\#(t) - U_j\#(\theta_j, t) \tag{2'}$$

$$c_{ej}(t) = \text{const.} \tag{3'}$$

$$\frac{\partial c_{sj}(r_j, t)}{\partial t} = D_{sj}\left[\frac{\partial^2 c_{sj}}{\partial r_j^2} + \frac{2}{r_j}\frac{\partial c_{sj}}{\partial r_j}\right] \tag{4'}$$

$$\left.\frac{\partial c_{sj}(r_j, t)}{\partial t}\right|_{r_j=0} = 0 \tag{5'}$$

$$\left.\frac{\delta[\varepsilon_{sj} \cdot c_{sj}(r_j, t)]}{\delta t}\right|_{r_j=r_{sj}} = -\frac{j_j\#(\theta_j, t)}{a_{sj}F} \tag{6'}$$

$$c_{sej} = c_{sj}(r_{sj}, t) \tag{8'}$$

In an expression (3'), it is assumed that the concentration of the electrolytic solution remains unchanged over time, so that $c_{ej}(t)$ is a constant value. When the battery is used such that a current load is high and the salt concentration is unevenly distributed, the salt concentration distribution is preferably considered. For the active material models 118n and 118p, the diffusion equations (4) to (6) are transformed into diffusion equations (4') to (6') by taking account of only the distribution in polar coordinate directions. In an expression (8'), an ion concentration $c_{sej}$ at the active material interface corresponds to an ion concentration $c_{si}(t)$ in the outermost one of the N regions shown in FIG. 10.

The expression (9) relating to the conservation law of charge in the electrolytic solution is simplified into the following expression (12) by using the expression (3'). A potential $\phi_{ej}$ of the electrolytic solution is approximated as a quadratic function of x. An average potential $\phi_{ej}\#$ in the electrolytic solution for use in calculating an overvoltage $\eta_j\#$ is determined from the following expression (13) which is provided by integrating the expression (12) with respect to an electrode thickness $L_j$.

For the negative electrode 112, the following expression (14) holds on the basis of an expression (12). A potential difference between an electrolytic solution average potential $\phi_{e2}\#$ and an electrolytic solution potential at a boundary between the negative electrode 112 and the separator 114 is represented by the following expression (15). For the positive electrode 115, a potential difference between an electrolytic solution average potential $\phi_{e1}\#$ and an electrolytic solution potential at a boundary between the positive electrode 115 and the separator 114 is represented by the following expression (16).

$$\nabla \cdot \left[\kappa_j^{eff}(t)\nabla \phi_{ej}(x, t)\right] + j_j\#(\theta_j, t) = 0 \Leftrightarrow \phi_{ej}(x, t) = -\frac{j_j\#(\theta_j, t)}{2\kappa_j^{eff}}x^2 \tag{12}$$

$$\phi_{ej}\#(t) = -\frac{j_j\#(\theta_j, t)}{2\kappa_j^{eff}} \cdot \frac{1}{L_j}\int_0^{L_j} x^2\,dx = -\frac{j_j\#(\theta_j, t)}{6\kappa_j^{eff}} \cdot L_j^2 \tag{13}$$

$$\phi_{e2}(L_2, t) = -\frac{j_2\#(\theta_2, t)}{2\kappa_2^{eff}}L_2^2 \tag{14}$$

$$\phi_{e2}\#(t) - \phi_{e2}(L_2, t) = -\frac{j_2\#(\theta_2, t)}{6\kappa_2^{eff}}L_2^2 - \left(-\frac{j_2\#(\theta_2, t)}{2\kappa_2^{eff}}L_2^2\right) \tag{15}$$
$$= \frac{j_2\#(\theta_2, t)}{3\kappa_2^{eff}}L_2^2 = \frac{L_2}{3\kappa_2^{eff}}I$$

$$\phi_{e1}\#(t) - \phi_{e1}(L_1, t) = -\frac{j_1\#(\theta_1, t)}{3\kappa_1^{eff}}L_1^2 = -\frac{L_1}{3\kappa_1^{eff}}I \tag{16}$$

The expression (10) relating to the conservation law of charge in the active material can also be simplified into the following expression (17). A potential $\phi_{sj}$ of the active material is also approximated as a quadratic function of x. An average potential $\phi_{sj}\#$ in the active material for use in calculating the overvoltage $\eta_j\#$ is determined from the following expression (18) which is provided by integrating the expression (17) with respect to the electrode thickness $L_j$. For the positive electrode 115, a potential difference between an active material average potential $\phi_{s1}\#$ and an active material potential at a boundary between the active material 118p and the collector plate 116 is represented by the following expression (19). Similarly, for the negative electrode 112, an expression (20) holds.

$$\nabla \cdot \left[\sigma_j^{eff}\nabla \phi_{sj}(x, t)\right] - j_j\#(\theta_j, t) \Leftrightarrow \phi_{sj}(x, t) = \frac{j_j\#(\theta_j, t)}{2\sigma_j^{eff}}x^2 \tag{17}$$

-continued $$\phi_{sj}\#(t) = \frac{j_j\#(\theta_j, t)}{2\sigma_j^{eff}} \frac{1}{L_j} \int_0^{L_j} x^2 \, dx \quad (18)$$

$$\phi_{s1}\#(t) - \phi_{s1}(L_1, t) = -\frac{j_1\#(\theta_1, t)}{3\sigma_1^{eff}} L_1^2 = \frac{L_1}{3\sigma_1^{eff}} I \quad (19)$$

$$\phi_{s2}\#(t) - \phi_{s2}(L_2, t) = -\frac{j_2\#(\theta_2, t)}{3\sigma_2^{eff}} L_2^2 = \frac{L_2}{3\sigma_2^{eff}} I \quad (20)$$

Figure 11:
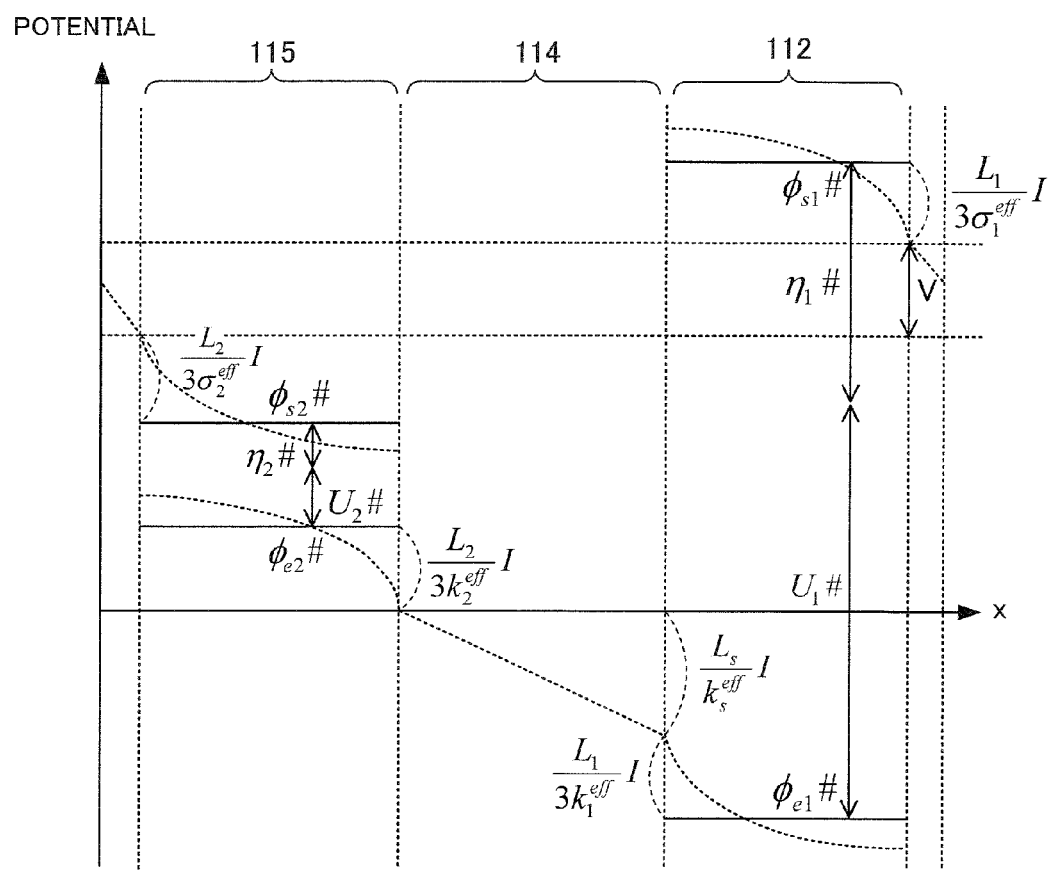
FIG. 11 A diagram showing the relationship between a terminal voltage of the cell and various average potentials.

FIG. 11 shows the relationship between a terminal voltage V(t) of the cell and each average voltage calculated as described above. In FIG. 11, since the reaction current density $j_j$ is zero in the separator 114, a voltage drop in the separator 114 is proportional to the current density I(t) and is $L_s/k_s^{eff}I(t)$.

Since it is assumed that the electrochemical reactions uniformly occur in the respective electrodes, the following expression (21) holds between the current density I(t) per unit area of the electrode plate and the reaction current density (produced ion amount) $j_j$.

$$I(t) = -j_1(\theta_1, t)L_1 = j_2(\theta_2, t)L_2 \quad (21)$$

Based on the potential relationship shown in FIG. 11 and the above expression (21), the following expression (22) holds for the battery voltage V(t). The expression (22) is based on an expression (23) representing the potential relationship shown in FIG. 11.

Next, when an average overvoltage $\eta\#(t)$ is calculated. Assuming that $j_j$ is constant and that $\alpha_{aj}$ and $\alpha_{cj}$ are set at 0.5 with the same charge and discharge efficiency in the Butler-Volmer equation, the following expression (24) holds. The expression (24) is inversely transformed to determine the average overvoltage $\eta\#(t)$ from the following expression (25).

$$V(t) = \phi_{s1}\#(t) - \frac{L_1}{3\sigma_1^{eff}} I(t) - \left(\phi_{s2}\#(t) + \frac{L_2}{3\sigma_2^{eff}} I(t)\right) \quad (22)$$

$$\phi_{sj}\#(t) = U_j\#(t) + \phi_{ej}\#(t) + \eta_j\#(t) \quad (23)$$

$$j_j\# = a_{sj} i_{0j}(\theta_j, t) \cdot \left[\exp\left(\frac{\alpha_{aj}F}{RT} \cdot \eta_j\#(t)\right) - \exp\left(-\frac{\alpha_{cj}F}{RT} \cdot \eta_j\#(t)\right)\right] \quad (24)$$

$$= 2a_{sj} i_{0j}(\theta_j, t) \sinh\left(\frac{\alpha_{aj}F}{RT} \cdot \eta_j\#(t)\right)$$

$$\eta_j\#(t) = \frac{RT}{\alpha_{aj}F} \text{arcsinh}\left(\frac{j_j\#(\theta_j, t)}{2a_{sj} i_{0j}(\theta_j, t)}\right) \quad (25)$$

The average potentials $\phi_{s1}$ and $\phi_{s2}$ are determined with reference to FIG. 11, and the determined values are substituted into the expression (22). In addition, average overvoltages $\eta_1\#(t)$ and $\eta_2\#(t)$ calculated from the expression (25) are substituted into the expression (23). As a result, a voltage-current relationship model expression (M1a) in accordance with the electrochemical reaction model expression is derived on the basis of the expressions (1'), (22), and (2').

The expression (4') representing the conservation law of ion concentration (diffusion equation) and the boundary condition expressions (5') and (6') are used to determine an active material diffusion model expression (M2a) for the active material models 118p and 118n.

$$V(t) = \{U_1\#(\theta_1, t) - U_2\#(\theta_2, t)\} + \frac{RT}{\alpha_{a1}F} \quad (M1a)$$

$$\left\{\text{arcsinh}\left(\frac{-I(t)}{2L_1 a_{s1} i_{01}(\theta_1, T, t)}\right) - \text{arcsinh}\left(\frac{I(t)}{2L_2 a_{s2} i_{02}(\theta_2, T, t)}\right)\right\} -$$

$$I(t)\left(\frac{L_1}{3\kappa_1^{eff}} + \frac{L_s}{\kappa_s^{eff}} + \frac{L_2}{3\kappa_2^{eff}} + \frac{L_1}{3\sigma_1^{eff}} + \frac{L_2}{3\sigma_2^{eff}}\right)$$

$$Rd(T) = \left(\frac{L_1}{3\kappa_1^{eff}} + \frac{L_s}{\kappa_s^{eff}} + \frac{L_2}{3\kappa_2^{eff}} + \frac{L_1}{3\sigma_1^{eff}} + \frac{L_2}{3\sigma_2^{eff}}\right) \quad (M2a)$$

$$\frac{\partial c_{s1}(r_1, t)}{\partial t} = D_{s1}(T)\left[\frac{\partial^2 c_{s1}}{\partial r_1^2} + \frac{2}{r_1} \frac{\partial c_{s1}}{\partial r_1}\right]$$

$$\frac{\partial c_{s2}(r_2, t)}{\partial t} = D_{s2}(T)\left[\frac{\partial^2 c_{s2}}{\partial r_2^2} + \frac{2}{r_2} \frac{\partial c_{s2}}{\partial r_2}\right]$$

In the model expression (M1a), a first term in a right side represents an OCV (Open circuit Voltage) determined by a reaction material concentration at the active material surface, a second term in the right side represents an overvoltage ($\eta_1\#-\eta_2\#$), and a third term in the right side represents a voltage drop due to a battery current. Thus, a DC pure resistance of the cell 11 is represented by Rd(T) in the expression (M1a).

Figure 12:
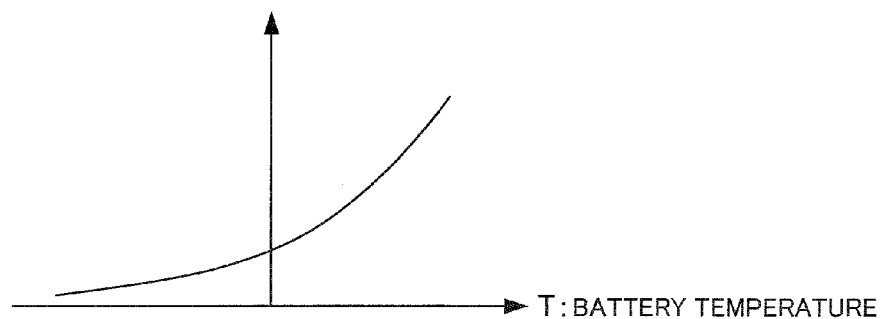
FIG. 12 A graph for explaining temperature dependency of a diffusion coefficient.

In the expression (M2a), diffusion coefficients $D_{s1}$ and $D_{s2}$ used as parameters for defining the diffusion rate of the reaction material have temperature dependence. Thus, the diffusion coefficients $D_{s1}$ and $D_{s2}$ can be set by using a map shown in FIG. 12, for example. The map shown in FIG. 12 can be previously obtained. In FIG. 12, a battery temperature T on the horizontal axis is acquired by a temperature sensor. As shown in FIG. 12, the diffusion coefficients $D_{s1}$ and $D_{s2}$ are reduced as the battery temperature drops. In other words, the diffusion coefficients $D_{s1}$ and $D_{s2}$ are increased as the battery temperature rises.

For the diffusion coefficients $D_{s1}$ and $D_{s2}$, not only the temperature dependence but also the dependence on the local SOCθ may be considered. In this case, a map representing the relationship between the battery temperature T, the local SOCθ, and the diffusion coefficient $D_{s1}$ and $D_{s2}$ may be previously provided.

Figure 13A:
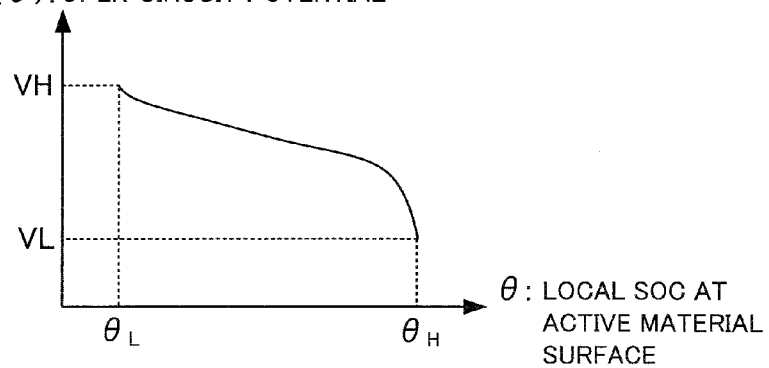
FIG. 13A A graph showing the relationship between an open circuit voltage (positive electrode) and a local SOC.
Figure 13B:
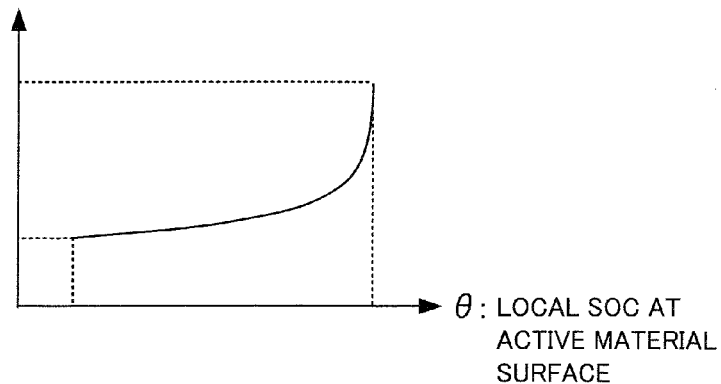
FIG. 13B A graph showing the relationship between an open circuit voltage (negative electrode) and a local SOC.

As shown in FIG. 13A, a positive electrode open circuit potential $U_1$ included in the expression (M1a) is reduced as the local SOCθ is increased. As shown in FIG. 13B, a negative electrode open circuit voltage $U_2$ is increased as the local SOCθ is increased. By previously providing maps shown in FIG. 13A and FIG. 13B, the single electrode open circuit potentials $U_1$ and $U_2$ corresponding to the local SOCθ can be specified.

Exchange current densities $i_{01}$ and $i_{02}$ included in the expression (M1a) have dependence on the local SOCθ and the battery temperature T. By previously providing maps representing the relationship between the exchange current densities $i_{01}$ and $i_{02}$, the local SOCθ, and the battery temperature T, the exchange current densities $i_{01}$ and $i_{02}$ can be specified from the local SOCθ and the battery temperature T.

The DC pure resistance Rd has dependence on temperature. By previously providing a map representing the relationship between the DC pure resistance Rd and the battery temperature T, the DC pure resistance Rd can be specified from the battery temperature T. The maps described above can be formed on the basis of the results of experiment on well-known AC impedance measurements for the cell 11, for example.

An expression (M1b) is obtained by linearly approximating arcsinh terms in the expression (M1a). The linear approximation can reduce the computation load or shorten the computation time.

$$V(t) = \{U_1\#(\theta_1, t) - U_2\#(\theta_2, t)\} + \qquad (M1b)$$
$$\left\{\frac{RT}{\alpha_{a1}F}\frac{-I(t)}{2L_1 a_{s1} i_{01}(\theta_1, T, t)} - \frac{RT}{\alpha_{a1}F}\frac{-I(t)}{2L_2 a_{s2} i_{02}(\theta_2, T, t)}\right\} -$$
$$I(t)\left(\frac{L_1}{3\kappa_1^{eff}} + \frac{L_s}{\kappa_s^{eff}} + \frac{L_2}{3\kappa_2^{eff}} + \frac{L_1}{3\sigma_1^{eff}} + \frac{L_2}{3\sigma_2^{eff}}\right)$$

$$Rd(T) = \left(\frac{L_1}{3\kappa_1^{eff}} + \frac{L_s}{\kappa_s^{eff}} + \frac{L_2}{3\kappa_2^{eff}} + \frac{L_1}{3\sigma_1^{eff}} + \frac{L_2}{3\sigma_2^{eff}}\right)$$

$$Rr(\theta_1, \theta_2, T) = \frac{RT}{2\alpha_{a1}F}\left\{\frac{1}{L_1\alpha_{s1}i_{01}(\theta_1, T)} + \frac{1}{L_2\alpha_{s2}i_{02}(\theta_2, T)}\right\} \qquad (26)$$

$$V(t) = \{U_1\#(\theta_1, t) - U_2\#(\theta_2, t)\} - Rr(\theta_1, \theta_2, T)I(t) - Rd(T) \cdot I(t) \qquad (27)$$

In the expression (M1b), as the result of the linear approximation, a second term in a right side is represented by the product of the current density I(t) and a reaction resistance Rr. As shown in an expression (26), the reaction resistance Rr is calculated from the exchange current densities $i_{01}$ and $i_{02}$ depending on the local $SOC\theta$ and the battery temperature T. Thus, for using the expression (M1b), a map representing the relationship between the local $SOC\theta$, the battery temperature T, and the exchange current densities $i_{01}$ and $i_{02}$ may be previously provided. According to the expressions (M1b) and (26), an expression (27) can be obtained.

As shown in FIG. 13A and FIG. 13B, the positive electrode open circuit potential and the negative electrode open circuit potential are previously acquired in the battery model described above. The expressions (M1a) and (M2a) can be used to calculate a positive electrode potential and a negative electrode potential during the passage of current. Specifically, the resistance component of the cell 11 (the positive electrode and the negative electrode) is previously calculated, and the positive electrode potential during the passage of current can be calculated from the positive electrode open circuit potential and the resistance component. Similarly, the negative electrode potential during the passage of current can be calculated from the negative electrode open circuit potential and the resistance component.

The open circuit voltage OCV of the cell 11 has the property of reducing as the discharge proceeds. The deteriorated cell 11 experiences a larger voltage drop than that of the cell 11 in the initial state for the same discharge time. This means that the deterioration of the cell 11 reduces the full charge capacity and changes the open circuit voltage characteristics. In the present embodiment, the change in the open circuit voltage characteristics due to the deterioration of the cell 11 is modeled as two phenomena presumably occurring within the deteriorated cell 11.

The two phenomena are a reduction in single electrode capacity in the positive electrode and the negative electrode and a composite correspondence mismatch between the positive electrode and the negative electrode. Although the present embodiment considers both the reduction in single electrode capacity in the positive electrode and the negative electrode and the composite correspondence mismatch between the positive electrode and the negative electrode, only the composite correspondence mismatch may be considered.

The reduction in single electrode capacity represents a reduction in ability to receive ions in each of the positive electrode and the negative electrode. The ions are lithium ions when the cell 11 is the lithium-ion secondary battery. The reduction in ability to receive ions means a reduction in the active materials and the like effectively functioning in charge and discharge.

Figure 14:
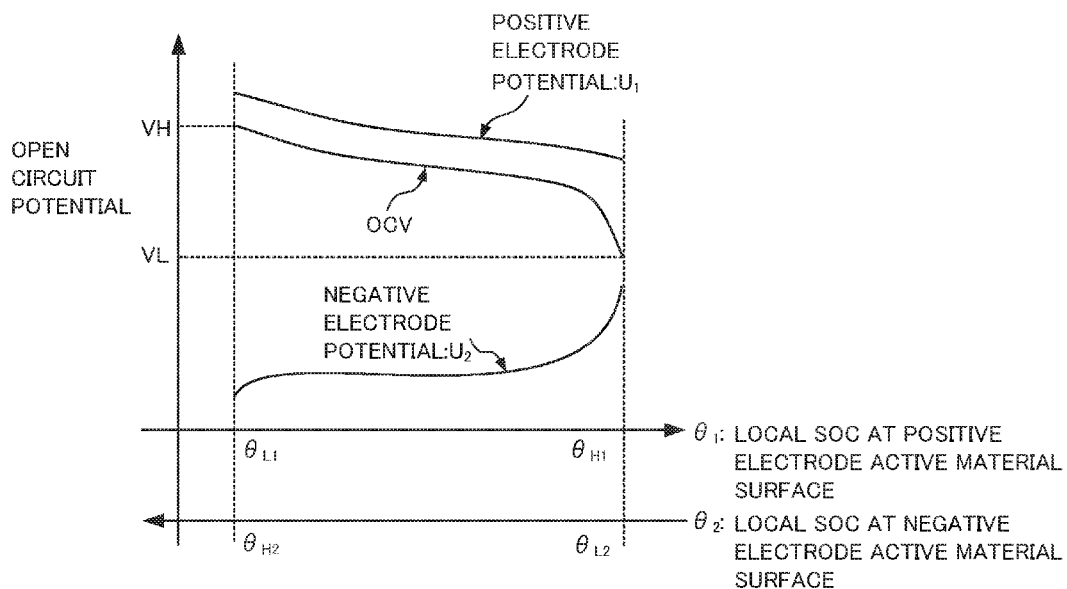
FIG. 14 A graph showing the characteristics of changes in open circuit voltage with respect to changes in local SOCs.
Figure 15:
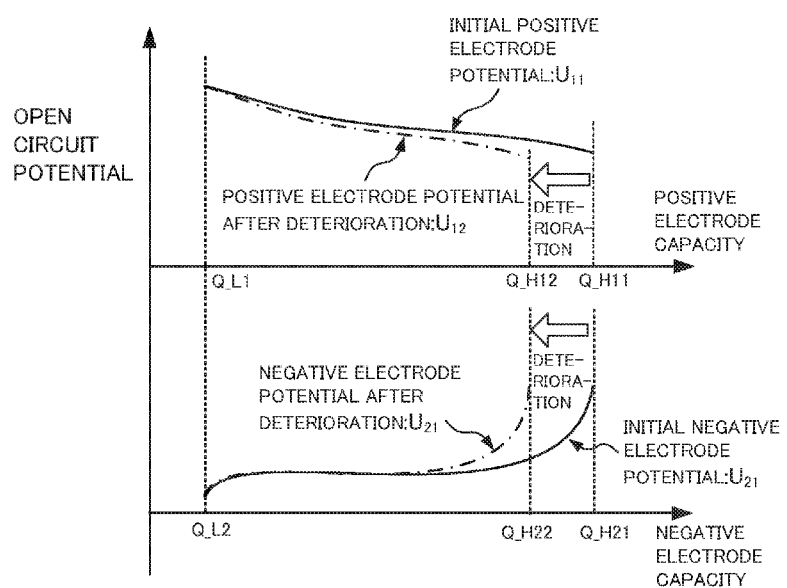
FIG. 15 A graph showing changes in single electrode open circuit potential with reductions in single electrode capacity.

FIG. 14 shows the open circuit potentials including the positive electrode open circuit potential $U_1$ and the negative electrode open circuit potential $U_2$ when the cell 11 is in the initial state (not deteriorated) and corresponds to FIG. 13A and FIG. 13B. FIG. 15 schematically shows changes in single electrode open circuit potential due to the reduction in single electrode capacity. In FIG. 15, Q_L1 on the axis of the positive electrode capacity indicates a capacity for a local $SOC\theta_{L1}$ in FIG. 14 in the initial state of the cell 11, and Q_H11 indicates a capacity for a local $SOC\theta_{H1}$ in FIG. 14 in the initial state of the cell 11. Q_L2 on the axis of the negative electrode capacity indicates a capacity for a local $SOC\theta_{L2}$ in FIG. 14 in the initial state of the cell 11, and Q_H21 indicates a capacity for a local $SOC\theta_{H2}$ in FIG. 14 in the initial state of the cell 11.

When the ability to receive ions is reduced in the positive electrode, the capacity for the local $SOC\theta_1$ is changed from Q_H11 to Q_H12. When the ability to receive ions is reduced in the negative electrode, the capacity for the local $SOC\theta_2$ is changed from Q_H21 to Q_H22.

Even when the cell 11 is deteriorated, the relationship (the relationship shown in FIG. 14) between the local $SOC\theta_1$ and the positive electrode open circuit potential $U_1$ is not changed. When the relationship between the local $SOC\theta_1$ and the positive electrode open circuit potential $U_1$ is converted into the relationship between the positive electrode capacity and the positive electrode open circuit potential, the curve representing the relationship between the positive electrode capacity and the positive electrode open circuit potential is shortened from the curve representing the initial state by the deterioration of the cell 11 as shown in FIG. 15.

When the relationship between the local $SOC\theta_2$ and the negative electrode open circuit potential $U_2$ is converted into the relationship between the negative electrode capacity and the negative electrode open circuit potential, the curve representing the relationship between the negative electrode capacity and the negative electrode open circuit potential is shortened from the curve representing the initial state by the deterioration of the cell 11 as shown in FIG. 15.

Figure 16:
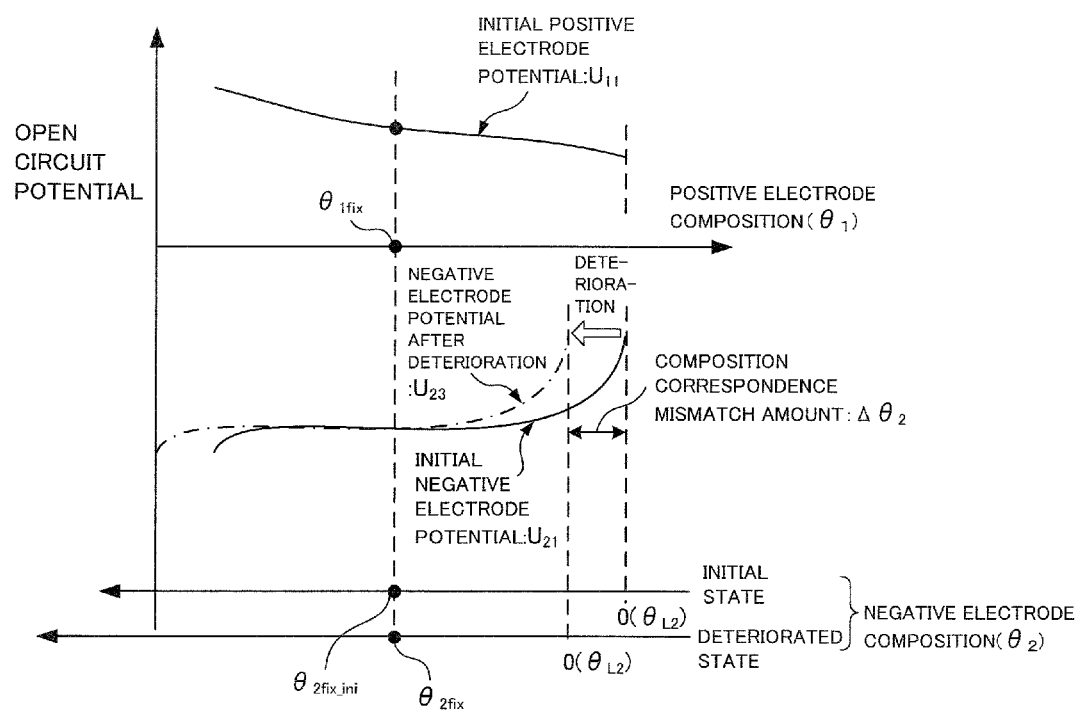
FIG. 16 A graph for explaining a composition correspondence mismatch between the positive electrode and the negative electrode.

FIG. 16 schematically shows a composition correspondence mismatch between the positive electrode and the negative electrode. The composition correspondence mismatch means a mismatch between the combination of a composition ($\theta_1$) of the positive electrode and a composition ($\theta_2$) of the negative electrode in the initial state of the cell 11 and the combination after the charge and discharge are performed using the set of the positive electrode and the negative electrode.

Each of the curves representing the relationships between the compositions $\theta_1$ and $\theta_2$ of the single electrodes and the open circuit potentials $U_1$ and $U_2$ is similar to that shown in FIG. 14. When the cell 11 is deteriorated, the axis of the negative electrode composition $\theta_2$ is shifted by $\Delta\theta_2$ to a lower positive electrode composition $\theta_1$. This causes the curve representing the relationship between the negative electrode composition $\theta_2$ and the negative electrode open circuit potential $U_2$ to be shifted by $\Delta\theta_2$ to a lower positive electrode composition $\theta_1$ relative to the curve representing the initial state.

The composition of the negative electrode for a composition $\theta_{1fix}$ of the positive electrode is "$\theta_{2fix\_ini}$" in the initial state of the cell 11, and is "$\theta_{2fix}$" after the deterioration of the cell 11. In FIG. 16, a negative electrode composition $\theta_{L2}$ shown in FIG. 14 is set at zero, and this indicates a state in which all of the ions in the negative electrode are eliminated.

In the present embodiment, three deterioration parameters are introduced in the battery model to model the two deterioration phenomena described above. The three deterioration parameters include a positive electrode capacity ratio, a negative electrode capacity ratio, and a positive/negative electrode composition correspondence mismatch amount. A method of modeling the two deterioration phenomena is described in the following.

The positive electrode capacity ratio refers to the ratio of the positive electrode capacity in the deteriorated state to the positive electrode capacity in the initial state. It is assumed that, when the cell 11 is deteriorated, the positive electrode capacity is reduced by an arbitrary amount from the capacity in the initial state. The positive electrode capacity ratio $k_1$ is represented by the following expression (28):

$$k_1 = \frac{Q_{1\_ini} - \Delta Q_1}{Q_{1\_ini}} \quad (28)$$

$$(0 < k_1 < 1)$$

$Q_{1\_ini}$ represents the positive electrode capacity (Q_H11 shown in FIG. 15) when the cell 11 is in the initial state, $\Delta Q_1$ represents the amount of reduction in positive electrode capacity after the cell 11 is deteriorated. The positive electrode capacity $Q_{1\_ini}$ can be previously determined from the theoretical amount and the provided amount of the active material and the like.

The negative electrode capacity ratio refers to the ratio of the negative electrode capacity in the deteriorated state to the negative electrode capacity in the initial state. It is assumed that, when the cell 11 is deteriorated, the negative electrode capacity is reduced by an arbitrary amount from the capacity in the initial state. The negative electrode capacity ratio $k_2$ is represented by the following expression (29):

$$k_2 = \frac{Q_{2\_ini} - \Delta Q_2}{Q_{2\_ini}} \quad (29)$$

$$(0 < k_2 < 1)$$

$Q_{2\_ini}$ represents the negative electrode capacity (Q_H21 shown in FIG. 15) when the cell 11 is in the initial state, $\Delta Q_2$ represents the amount of reduction in negative electrode capacity after the cell 11 is deteriorated. The negative electrode capacity $Q_{2\_ini}$ can be previously determined from the theoretical amount and the provided amount of the active material and the like.

Figure 17:
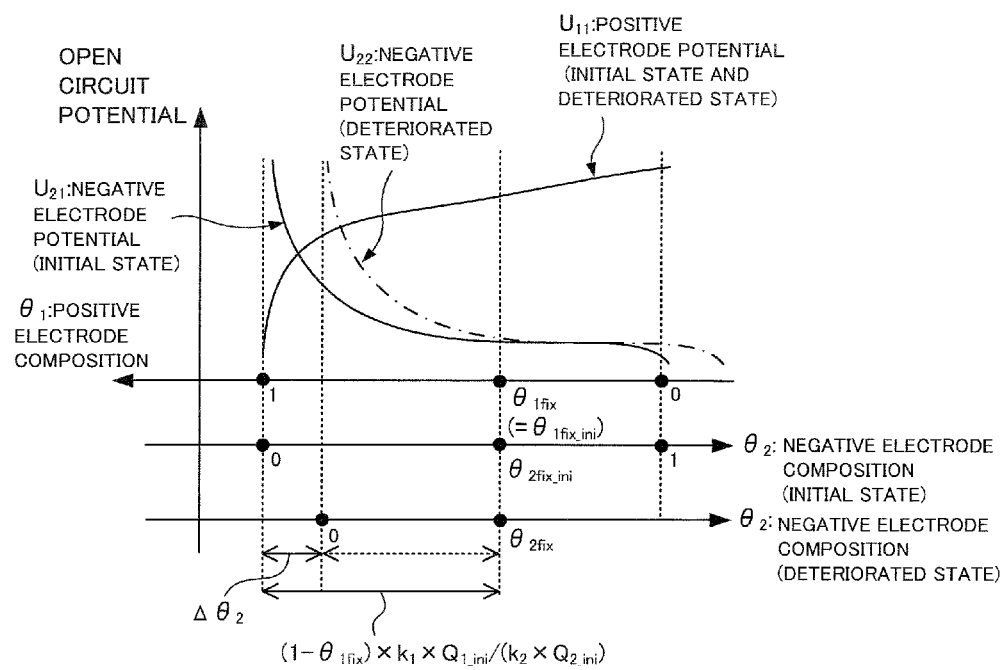
FIG. 17 A graph for explaining a composition correspondence mismatch due to deterioration.

FIG. 17 is a schematic diagram for explaining the composition correspondence mismatch between the positive electrode and the negative electrode.

Once the cell 11 is deteriorated, the capacity at a negative electrode composition $\theta_2$ of 1 is $(Q_{2\_ini} - \Delta Q_2)$. A composition correspondence mismatch capacity $\Delta Q_s$ between the positive electrode and the negative electrode is a capacity for a mismatch amount $\Delta\theta_2$ of the negative electrode composition axis relative to the positive electrode composition axis. Thus, the relationship shown in the following expression (30) holds:

$$1 : \Delta\theta_2 = (Q_{2\_ini} - \Delta Q_2) : \Delta Q_s \quad (30)$$

The following expression (31) is derived from the expression (29) and the expression (30):

$$\Delta Q_s = (Q_{2\_ini} - \Delta Q_2) \times \Delta\theta_2 \quad (31)$$
$$= k_2 \times Q_{2\_ini} \times \Delta\theta_2$$

When the cell 11 is in the initial state, a positive electrode composition $\theta_{1fix\_ini}$ corresponds to the negative electrode composition $\theta_{2fix\_ini}$. When the cell 11 is in the deteriorated state, the positive electrode composition $\theta_{1fix}$ corresponds to the negative electrode composition $\theta_{2fix}$. The composition correspondence mismatch is based on the positive electrode composition $\theta_{1fix}$ in the initial state. Thus, the positive electrode composition $\theta_{1fix}$ and the positive electrode composition $\theta_{1fix\_ini}$ have the same value.

When the deterioration of the cell 11 produces the composition correspondence mismatch between the positive electrode and the negative electrode, the positive electrode composition $\theta_{1fix}$ and the negative electrode composition $\theta_{2fix}$ after the deterioration of the cell 11 have the relationship represented by the following expressions (32) and (33):

$$\theta_{1fix} = \theta_{1fix\_ini} \quad (32)$$

$$Q_{2fix} = \frac{(1 - \theta_{1fix}) \times k_1 \times Q_{1\_ini} - \Delta Q_s}{k_2 \times Q_{2\_ini}} \quad (33)$$

Description is now made of the meaning of the expression (33). When the positive electrode composition $\theta_1$ is changed (reduced) from 1 to $\theta_{1fix}$ due to the deterioration of the cell 11, the amount A of the ion released from the positive electrode is represented by the following expression (34):

$$A = (1 - \theta_{1fix}) \times k_1 \times Q_{1\_ini} \quad (34)$$

The value of $(1 - \theta_{1fix})$ indicates the change in positive electrode composition due to the deterioration. The value of $(k_1 \times Q_{1\_ini})$ indicates the positive electrode capacity after the deterioration of the cell 11.

Assuming that all of the ions released from the positive electrode are taken into the negative electrode, the negative electrode composition $\theta_{2fix}$ is represented by the following expression (35):

$$Q_{2fix} = \frac{(1 - \theta_{1fix}) \times k_1 \times Q_{1\_ini}}{k_2 \times Q_{2\_ini}} \quad (35)$$

The value of $(k_2 \times Q_{2\_ini})$ indicates the negative electrode capacity after the deterioration of the cell 11.

When the composition correspondence mismatch ($\Delta\theta_2$) between the positive electrode and the negative electrode exists, the negative electrode composition $\theta_{2fix}$ is represented by the following expression (36):

$$Q_{2fix} = \frac{(1 - \theta_{1fix}) \times k_1 \times Q_{1\_ini}}{k_2 \times Q_{2\_ini}} - \Delta\theta_2 \quad (36)$$

As shown in the expression (31), the composition correspondence mismatch amount $\Delta\theta_2$ can be represented by using the composition correspondence mismatch capacity $\Delta Q_s$. Thus, the negative electrode composition $\theta_{2fix}$ is represented by the above expression (33).

As shown in FIG. 17, the open circuit voltage OCV in the deteriorated state of the cell 11 is represented as a potential difference between the positive electrode open circuit potential $U_{11}$ and the negative electrode open circuit potential $U_{22}$ in the deteriorated state. Once the three parameters $k_1$, $k_2$, and $\Delta Q_s$ are estimated, the negative electrode open circuit potential $U_{22}$ and the positive electrode open circuit potential $U_{11}$ in the deteriorated state of the cell 11 can be specified. Then, the open circuit voltage OCV can be calculated as the potential difference between the negative electrode open circuit potential $U_{22}$ and the positive electrode open circuit potential $U_{11}$.

The estimation of the deterioration parameters $k_1$, $k_2$, and $\Delta Q_s$ is performed, for example, by measuring the open circuit voltage OCV (actually measured value) of the cell 11 and comparing the open circuit voltage OCV (actually measure value) with the open circuit voltage OCV (estimated value) estimated from the deterioration parameters $k_1$, $k_2$, and $\Delta Q_s$. The deterioration parameters $k_1$, $k_2$, and $\Delta Q_s$ can be changed to match the open circuit voltage OCV (estimated value) with the open circuit voltage OCV (actually measured value). In other words, the three deterioration parameters $k_1$, $k_2$, and $\Delta Q_s$ at which the open circuit voltage OCV (estimated value) generally matches the open circuit voltage OCV (actually measured value) can be searched for.

The determination of whether or not the open circuit voltage OCV (estimated value) matches the open circuit voltage OCV (actually measured value) can be made in view of a predetermined error. The deterioration parameters when the open circuit voltage OCV (estimated value) matches the open circuit voltage OCV (actually measured value) can be used to specify the negative electrode open circuit potential $U_{22}$ and the positive electrode open circuit potential $U_{11}$ when the cell 11 is in the deteriorated state.

The use of the deterioration parameters $k_1$, $k_2$, and $\Delta Q_s$ can correct the positive electrode open circuit potential $U_1$ and the negative electrode open circuit potential $U_2$ depending on the deterioration of the cell 11. This can calculate the positive electrode open circuit potential and the negative electrode open circuit potential associated with the deterioration state of the cell 11. Once the positive electrode open circuit potential and the negative electrode open circuit potential can be calculated, the positive electrode potential and the negative electrode potential during the passage of current can be calculated by taking account of the resistance component of the cell 11. The calculated positive electrode potential and negative electrode potential can be compared with the threshold potentials (Vth11, Vth12, Vth21, and Vth22) to control the charge and discharge of the cell 11.

In the present embodiment, the relationship between the negative electrode composition and the negative electrode open circuit potential can be corrected, the relationship between the positive electrode composition and the positive electrode open circuit potential can be corrected, and the charge and discharge of the cell 11 can be controlled on the basis of the corrected negative electrode open circuit potential and the corrected positive electrode open circuit potential. In other words, the negative electrode open circuit potential and the positive electrode open circuit potential at the present point in time can be obtained, including not only the initial state but also the deteriorated state, and the charge and discharge control of the cell 11 can be performed in accordance with the obtained negative electrode open circuit potential and positive electrode open circuit potential. As a result, while the cell 11 is appropriately protected, extreme limitation on the charge and discharge of the cell 11 can be suppressed to make the most of the cell 11.

Embodiment 2

Next, description is made of control of charge and discharge of a cell 11 in Embodiment 2 of the present invention. Members identical to those described in Embodiment 1 are designated with the same reference numerals, and detailed description thereof is omitted. The present embodiment differs from Embodiment 1 in a method of calculating a positive electrode potential and a negative electrode potential. The following description is mainly focused on differences from Embodiment 1.

The resistance components of a cell 11 include a DC resistance component, a reaction resistance component, and a diffusion resistance component. The DC resistance component is a resistance found when ions and electrons move between a positive electrode and a negative electrode. It is assumed herein that the DC resistance component also includes a concentration overvoltage produced by a difference in salt concentration between the positive electrode and the negative electrode. The reaction resistance component is a resistance found when charges are transferred at a surface (interface) of each of a positive electrode active material and a negative electrode active material. The diffusion resistance component represents a potential gradient caused by an ion concentration in the active material (each of the positive electrode and the negative electrode).

Side reactions occurring in the positive electrode and the negative electrode of the cell 11 include those described in Embodiment 1. For example, when the cell 11 is discharged, a material forming a collector plate is dissolved in the negative electrode as a side reaction. When the cell 11 is discharged, the structure or the crystal structure may change in the positive electrode as a side reaction. When the cell 11 is charged, lithium may be precipitated in the negative electrode as a side reaction, and an electrolytic solution near the positive electrode may be decomposed.

Many of the side reactions depend on the reaction resistance component and the diffusion resistance component. Thus, the DC resistance component can be removed in terms of the side reaction. In calculating the positive electrode potential and the negative electrode potential during discharge or in calculating the positive electrode potential and the negative electrode potential during charge, only the reaction resistance component and the diffusion resistance component may be considered as the resistance components of the cell 11.

A reference electrode can be used in calculating the resistance provided by adding only the reaction resistance component and the diffusion resistance component. The reference electrode can be used to measure the positive electrode potential and the negative electrode potential. Since the DC resistance component depends mainly on the temperature of the cell 11, the correspondence between the DC resistance component and the temperature can be previously determined by an experiment. A map representing the correspondence can be stored in a memory 31. Although the correspondence between the DC resistance component and the temperature is determined in this case, the dependence on SOC (State Of Charge) may be included in the correspondence.

Changes in the DC resistance component in response to the deterioration of the cell 11 can be previously determined by an experiment. Since the deterioration of the cell 11 proceeds over time, the changes in the DC resistance component with the deterioration of the cell 11 can be represented as a map showing changes in the DC resistance component over time or as a function in a coordinate system where coordinate axes represent the time and the DC resistance component. Once the DC resistance component associated with the deterioration of the cell 11 is obtained, the resistance can be calculated by adding only the reaction resistance component and the diffusion resistance component for the deteriorated cell 11. When it is shown by a previously conducted experiment or the like that changes in the DC resistance component are negligibly small, the DC resistance component may not be considered. In this case, a memory necessary to hold the map representing the changes in the DC resistance component can be omitted.

Once the DC resistance component can be specified, a voltage change amount ($\Delta V=IR$) resulting from the DC resistance component can be calculated. The voltage change amount resulting from the DC resistance component can be subtracted from the positive electrode potential and the negative electrode potential measured with the reference electrode to calculate the positive electrode potential and the negative electrode potential influenced only by the reaction resistance component and the diffusion resistance component. Specifically, since the positive electrode potential and the negative electrode potential measured with the reference electrode is a single electrode potential influenced by the DC resistance component, the reaction resistance component, and the diffusion resistance component, the voltage change amount resulting from the DC resistance component can be subtracted from the single electrode potential to calculate the single electrode potential influenced only by the reaction resistance component and the diffusion resistance component.

Alternatively, the resistance provided by adding only the reaction resistance component and the diffusion resistance component can be calculated by using the battery model described in Embodiment 1.

The battery model has the positive electrode open circuit potential (FIG. 13A) and the negative electrode open circuit potential (FIG. 13B) in the initial state of the cell 11. In the battery model, the DC resistance component can be calculated. As a result, the positive electrode potential and the negative electrode potential can be calculated by considering only the diffusion resistance component and the reaction resistance component. Specifically, when the DC resistance component Rd is not considered in the expression (M1a) and the expression (M2a) described in Embodiment 1, the positive electrode potential and the negative electrode potential can be calculated by considering only the diffusion resistance component and the reaction resistance component.

Since the reaction resistance component and the diffusion resistance component depend on the temperature, the SOC (state of charge), and the current value of the cell 11, the correspondence with the temperature, the SOC, and the current value may be previously determined by an experiment or the like. Data representing the correspondence can be stored in the memory 31. Although the correspondence with the temperature, the SOC, and the current value is determined in this case, the correspondence with one of the temperature, the SOC and the current value may be determined instead.

Once the temperature, the SOC, and the current value can be acquired, and the data representing the correspondence stored in the memory 31 can be used to specify the resistance of the two components (the sum of the reaction resistance component and the diffusion resistance component) associated with the acquired temperature, SOC, and current value. After the resistance of the two components is specified, the positive electrode potential and the negative electrode potential may be corrected by the potential corresponding to the resistance of the two components.

After the positive electrode potential and the negative electrode potential during charge and discharge can be calculated, the positive electrode potential and the negative electrode potential can be compared with the threshold potentials (Vth11, Vth12, Vth21, and Vth22) similarly to Embodiment 1 (FIG. 2 and FIG. 4) to control the charge and discharge of the cell 11.

The invention claimed is:

1. A control apparatus comprising a controller configured to control charge and discharge of a secondary battery,
   wherein the controller acquires a positive electrode potential and a negative electrode potential of the secondary battery, the positive electrode potential corresponding to electrical potential energy difference between a positive electrode of the second battery and a reference electrode of the second battery, the negative electrode potential corresponding to an electrical potential energy difference between a negative electrode of the second battery and a reference electrode of the second battery,
   the controller reduces a first upper limit of electric power that is supplied to the second battery in response to the positive electrode potential being greater than a first upper threshold potential or the negative electrode potential being less than a first lower threshold potential, to control the charge of the secondary battery,
   the controller reduces a second upper limit of electric power that it is output from the secondary battery in response to the positive electrode potential being less than a second upper threshold potential or the negative electrode potential being greater than a second lower threshold potential, to control the discharge of the secondary battery,
   the controller uses a deterioration parameter to correct a local charge of (SOC) at an active material surface of each of the positive electrode and the negative electrode and corrects an open circuit potential of each of the positive electrode and the negative electrode based on the corrected local SOC and open circuit potential characteristic data of the positive electrode potential and the negative electrode potential,
   the deterioration parameter includes a single electrode capacity ratio of the positive electrode, a single electrode capacity ratio of the negative electrode, and a variation in battery capacity of the secondary battery due to a change in correspondence between an average charge rate and a second average charge rate, the first average charge rate being an average of charge rates of the active material of the positive electrode, the second average charge rate being an average of charge rates of the active material of the negative electrode, the single electrode capacity ratio represents a ratio of a single electrode capacity in a deteriorated state to the single electrode capacity in an initial state,
   the open circuit potential characteristic data is data defining a relationship between the local SOC at a surface of the active material of the potential electrode and the open circuit potential of the positive electrode and a relationship between the local SOC at a surface of the active material of the negative electrode and the open circuit potential of the negative electrode, and the open circuit potential characteristic data of the negative electrode is shifted by the variation in battery capacity with respect to the open circuit potential characteristic data of the positive electrode.

2. A control method for controlling charge and discharge of a secondary battery, comprising:

acquiring a positive electrode potential and a negative electrode potential of the secondary battery, positive electrode potential corresponding to an electrical potential energy difference between a positive electrode of the second battery and a reference electrode of the second battery, the negative electrode potential corresponding to an electrical potential energy difference between a negative electrode of the second battery and the reference electrode of the second battery, reducing a first upper limit of electric power that is supplied to the secondary battery in response to the positive electrode potential being greater than a first upper threshold potential or the negative electrode potential being less than a first lower threshold potential, to control the charge of the secondary battery, reducing a second upper limit of electric power that it is output from the secondary battery in response to the positive electrode potential being less than a second upper threshold potential or the negative electrode potential being greater than a second lower threshold potential, to control the discharge of the secondary battery, using a deterioration parameter to correct a local state of charge (SOC) at an active material surface of each of the positive electrode and the negative electrode, and correcting an open circuit potential of each of the positive electrode and the negative electrode based on the corrected local SOC and open circuit potential characteristic data of the positive electrode potential and the negative electrode potential, wherein the deterioration parameter includes a single electrode capacity ratio of the positive electrode, a single electrode capacity ratio of the negative electrode, and a variation in battery capacity of the secondary battery that represents a variation between a first average charge rate and a second average charge rate, the first average charge rate being an average of charge rates of the active material of the positive electrode, the second average charge rate being an average of charge rates of the an active material of the negative electrode, the single electrode capacity ratio representing a ratio of a single electrode capacity in a deteriorated state to the single electrode capacity in an initial state, the open circuit potential characteristic data represents a relationship between the local SOC at a surface of the active material of the positive electrode and the open circuit potential of the positive electrode and a relationship between the local SOC at a surface of the active material of the negative electrode and the open circuit potential of the negative electrode, and the open circuit potential characteristic data of the negative electrode is shifted by the variation in battery capacity with respect to the open circuit potential characteristic data of the positive electrode.

* * * * *